United States Patent
Tao

(10) Patent No.: US 12,438,098 B2
(45) Date of Patent: Oct. 7, 2025

(54) PACKAGING STRUCTURE AND FABRICATION METHOD THEREOF

(71) Applicants: NANTONG TONGFU MICROELECTRONICS CO., LTD., Nantong (CN); TONGFU MICROELECTRONICS CO., LTD., Nantong (CN)

(72) Inventor: Yujuan Tao, Nantong (CN)

(73) Assignees: NANTONG TONGFU MICROELECTRONICS CO., LTD., Nantong (CN); TONGFU MICROELECTRONICS CO., LTD., Nantong (CN)

( * ) Notice: Subject to any disclaimer, the term of this patent is extended or adjusted under 35 U.S.C. 154(b) by 732 days.

(21) Appl. No.: 17/629,672

(22) PCT Filed: Jul. 17, 2020

(86) PCT No.: PCT/CN2020/102762
§ 371 (c)(1),
(2) Date: Jan. 24, 2022

(87) PCT Pub. No.: WO2021/017897
PCT Pub. Date: Feb. 4, 2021

(65) Prior Publication Data
US 2022/0285287 A1    Sep. 8, 2022

(30) Foreign Application Priority Data

Jul. 26, 2019 (CN) .......................... 201910681485.8
Jul. 26, 2019 (CN) .......................... 201910681489.6
(Continued)

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/561* (2013.01); *H01L 21/568* (2013.01);
(Continued)

(58) Field of Classification Search
CPC ........... H01L 23/28–3192; H01L 23/32; H01L 23/552–556; H01L 21/56–568;
(Continued)

(56) References Cited

U.S. PATENT DOCUMENTS

2002/0166681 A1* 11/2002 Mazurkiewicz ..... H05K 9/0039
257/E23.114
2012/0300412 A1* 11/2012 Song ................. H01L 23/49822
361/728
(Continued)

FOREIGN PATENT DOCUMENTS

CN    107006138 A    8/2017
CN    107305883 A    10/2017
(Continued)

OTHER PUBLICATIONS

World Intellectual Property Organization (WIPO) International Search Report for PCT/CN2020/102762 Oct. 20, 2020 4 Pages.

*Primary Examiner* — Julio J Maldonado
*Assistant Examiner* — Eric Manuel Mulero Flores
(74) *Attorney, Agent, or Firm* — Anova Law Group, PLLC

(57) ABSTRACT

Packaging structure and fabrication method are provided. The method includes: providing semiconductor chips; providing soldering pads on the semiconductor chips, a metal bump on each soldering pad, and a first plastic encapsulation layer on functional surfaces of the semiconductor chips; providing a carrier plate; adhering the first plastic encapsulation layer on the functional surfaces of the semiconductor chips to the carrier plate; forming a first shielding layer
(Continued)

covering non-functional surfaces and sidewalls of the semiconductor chips; forming a second shielding layer on the first shielding layer; forming a second plastic encapsulation layer on the second shielding layer and on the carrier plate between semiconductor chips; peeling off the carrier plate to form a pre-packaging plate; removing a portion of the first plastic encapsulation layer to expose the metal bumps; forming an external contact structure on the backside of the pre-packaging plate and connected to each metal bump.

16 Claims, 9 Drawing Sheets

(30) Foreign Application Priority Data

| | | |
|---|---|---|
| Jul. 26, 2019 | (CN) | 201910681772.9 |
| Jul. 26, 2019 | (CN) | 201910681773.3 |

(51) Int. Cl.
*H01L 23/00* (2006.01)
*H01L 23/31* (2006.01)

(52) U.S. Cl.
CPC .......... *H01L 23/3135* (2013.01); *H01L 24/03* (2013.01); *H01L 24/96* (2013.01); *H01L 2224/02311* (2013.01)

(58) Field of Classification Search
CPC ....... H01L 2221/68304–68395; H01L 21/673; H01L 21/67313; H01L 21/67316; H01L 21/67326; H01L 21/6733; H01L 21/02024; H01L 21/2633; H01L 21/32131–32132; H01L 21/463; H01L 21/4842; H01L 21/4878; H01L 21/4896; H01L 2924/3025; H01L 23/60
See application file for complete search history.

(56) References Cited

U.S. PATENT DOCUMENTS

| | | | | |
|---|---|---|---|---|
| 2014/0197505 | A1* | 7/2014 | Zhou | H01L 23/552 |
| | | | | 257/422 |
| 2015/0264797 | A1* | 9/2015 | Happoya | H05K 1/0222 |
| | | | | 361/783 |
| 2016/0093796 | A1* | 3/2016 | Arai | H01L 23/552 |
| | | | | 257/422 |
| 2016/0359100 | A1* | 12/2016 | Bhushan | H01L 24/96 |
| 2017/0110383 | A1* | 4/2017 | Huang | H01L 23/3135 |
| 2019/0006288 | A1* | 1/2019 | Wang | H01L 21/6835 |
| 2019/0372210 | A1* | 12/2019 | Mikata | H01L 21/56 |
| 2020/0337187 | A1* | 10/2020 | Otsubo | H01L 23/3121 |

FOREIGN PATENT DOCUMENTS

| | | |
|---|---|---|
| CN | 109216323 A | 1/2019 |
| CN | 109698188 A | 4/2019 |
| CN | 110473859 A | 11/2019 |
| CN | 110504175 A | 11/2019 |
| CN | 110504226 A | 11/2019 |
| CN | 110534445 A | 12/2019 |

* cited by examiner

PACKAGING STRUCTURE AND FABRICATION METHOD THEREOF

CROSS-REFERENCES TO RELATED APPLICATION

This application is a national phase entry under 35 U.S.C. § 371 of International Application No. PCT/CN2020/102762, filed on Jul. 17, 2020, which claims the priority of Chinese Patent Application No. 201910681489.6, filed on Jul. 26, 2019, Chinese Patent Application No. 201910681485.8, filed on Jul. 26, 2019, Chinese Patent Application No. 201910681772.9, filed on Jul. 26, 2019, and Chinese Patent Application No. 201910681773.3, filed on Jul. 26, 2019, the entire contents of all of which are incorporated herein by reference in their entirety.

TECHNICAL FIELD

The present disclosure generally relates to the field of semiconductor technologies and, more particularly, relates to a packaging structure with electromagnetic shielding and its fabrication method.

BACKGROUND

With the rapid development of a new generation of electronic products, integrated circuit packaging technology has developed towards a direction of high density, high frequency, miniaturization, and high integration level. Strong electromagnetic waves may often be generated from high-frequency chips, which induces undesirable interference or noise on chips in or out the packaging structures. The density of electronic devices also increases and distances between transmission wires become closer. Correspondingly, electromagnetic interference issues from inside or outside of integrated circuit packages becomes more severe gradually. The quality and service life of the integrated circuits are also reduced.

In electronic devices and electronic products, electromagnetic interference (EMI) energy is transmitted through conductive coupling and radiative coupling. To meet requirements of electromagnetic compatibility, filter technologies are needed for the conductive coupling, that is, EMI filter devices are used for suppressing the electromagnetic interference. For the radiated coupling, shielding technologies are needed for suppressing electromagnetic interference. Because existing electromagnetic spectrum has become increasingly dense, electromagnetic power density in a unit volume has dramatically increased, and a large number of high-level and low-level devices or equipment are used in a mixed manner. Correspondingly, electromagnetic environments of devices and systems deteriorate gradually. The importance of electromagnetic shielding becomes more prominent.

An existing electromagnetic shielding solution includes providing a magnetic field shielding layer on a semiconductor packaging structure to shield the electromagnetic interference between chips. There is a need to provide a packaging structure with improved electromagnetic shielding performance.

SUMMARY

One aspect of the present disclosure provides a fabrication method for forming a packaging structure. The method includes: providing semiconductor chips, each of that includes a functional surface and a non-functional surface opposite to the functional surface; providing soldering pads on functional surfaces of the semiconductor chips, a metal bump on each soldering pad, and a first plastic encapsulation layer on the functional surfaces of the semiconductor chips covering metal bumps; providing a carrier plate; adhering the first plastic encapsulation layer on the functional surfaces of the semiconductor chips to the carrier plate; forming a first shielding layer covering non-functional surfaces and sidewalls of the semiconductor chips; forming a second shielding layer on the first shielding layer; forming a second plastic encapsulation layer on the second shielding layer and on a portion of the carrier plate between semiconductor chips; peeling off the carrier plate to form a pre-packaging plate, wherein a backside of the pre-packaging plate exposes the first plastic encapsulation layer; removing a portion of the first plastic encapsulation layer to expose the metal bumps; forming an external contact structure on the backside of the pre-packaging plate and connected to each metal bump.

Another aspect of the present disclosure provides a packaging structure. The packaging structure includes: a pre-packaging plate; a second plastic encapsulation layer on the pre-packaging plate; semiconductor chips embedded in the second plastic encapsulation layer, each of that includes a functional surface and a non-functional surface opposite to the functional surface; soldering pads on functional surfaces of the semiconductor chips and exposed by the second plastic encapsulation layer; a metal bump on each soldering pad; a first plastic encapsulation layer on the functional surfaces of the semiconductor chips covering sidewalls of metal bumps and exposing top surfaces of the metal bumps; a first shielding layer and a second shielding layer between the semiconductor chips and the second plastic encapsulation layers, and between the first and the second plastic encapsulation layer; and an external contact structure connected to each metal bump on the first plastic encapsulation layer. A bottom surface of the first plastic encapsulation layer is flush with a bottom surface of the second plastic encapsulation layer. The first shielding layer covers the non-functional surfaces and the sidewalls of the semiconductor chips, and side surfaces of the first plastic encapsulation layer. The second shielding layer is located between the first shielding layer and the second plastic encapsulation layer, and completely covers a surface of a portion of the first shielding layer on the non-functional surfaces and the sidewalls of the semiconductor chips, and on the side surfaces of the first plastic encapsulation layer.

Another aspect of the present disclosure provides an discrete packaging structure formed by cutting a packaging structure. The discrete packaging structure includes: a second plastic encapsulation layer; a semiconductor chip in the second plastic encapsulation layer, including a functional surface and a non-functional surface opposite to the functional surface; soldering pads on the functional surface of the semiconductor chip, and exposed by the soldering pads; a metal bump on each soldering pad; a first plastic encapsulation layer on the functional surface of the semiconductor chip covering sidewalls of metal bumps and exposing top surfaces of the metal bumps; a first shielding layer and a second shielding layer between the semiconductor chips and the second plastic encapsulation layer, and between the first and the second plastic encapsulation layer; and an external contact structure connected to each metal bump on the first plastic encapsulation layer. The first shielding layer covers the non-functional surfaces and the sidewall of the semiconductor chip, and side surfaces of the first plastic encapsulation layer. The second shielding layer is located between the first shielding layer and the second plastic encapsulation layer, and completely cover a surface of a portion of the first shielding layer on the non-functional surface and the sidewalls of the semiconductor chip and on the side surfaces of the first plastic encapsulation layer. The packaging structure includes: a pre-packaging plate; a second plastic encapsulation layer on the pre-packaging plate; semiconductor chips embedded in the second plastic encapsulation layer, each of that includes a functional surface and a non-functional surface opposite to the functional surface; soldering pads on functional surfaces of the semiconductor chips and exposed by the second plastic encapsulation layer; a metal bump on each soldering pad; a first plastic encapsulation layer on the functional surfaces of the semiconductor chips covering sidewalls of metal bumps and exposing top surfaces of the metal bumps; a first shielding layer and a second shielding layer between the semiconductor chips and the second plastic encapsulation layers, and between the first and the second plastic encapsulation layer; and an external contact structure connected to each metal bump on the first plastic encapsulation layer. A bottom surface of the first plastic encapsulation layer is flush with a bottom surface of the second plastic encapsulation layer. The first shielding layer covers the non-functional surfaces and the sidewalls of the semiconductor chips, and side surfaces of the first plastic encapsulation layer. The second shielding layer is located between the first shielding layer and the second plastic encapsulation layer, and completely covers a surface of a portion of the first shielding layer on the non-functional surfaces and the sidewalls of the semiconductor chips, and on the side surfaces of the first plastic encapsulation layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
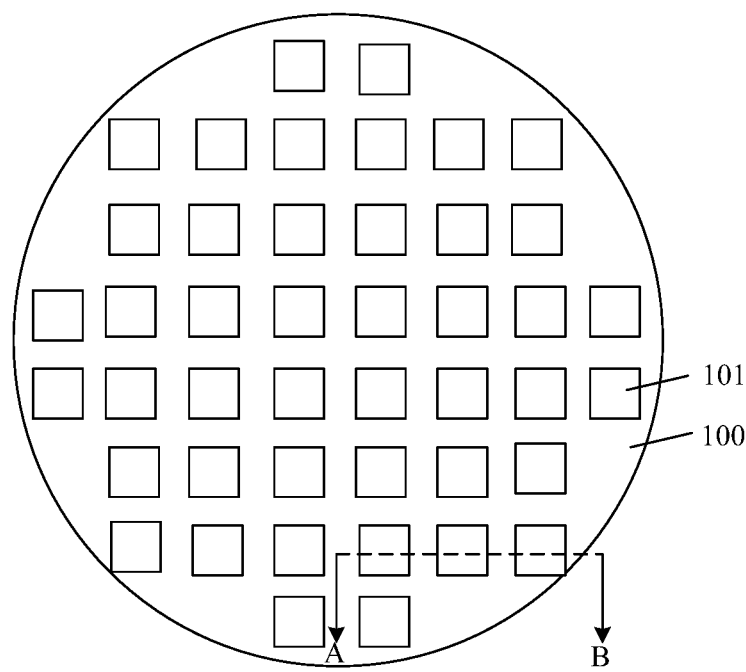
FIGS. 1-13 illustrate structures corresponding to certain stages in an exemplary fabrication method for forming a packaging structure according to various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts. For description purposes only, the embodiments below are used as examples to illustrate the present disclosure, and should not limit the scopes of the present disclosure.

In the description of the present application, it should be understood that the terms "first" and "second" are used for description purposes only, and cannot be understood as indicating or implying relative importance or implicitly indicating the number of technical features indicated. Thus, the features defined as "first" and "second" may explicitly or implicitly include one or more of the features. In the description of this application, the meaning of "plurality" is two or more, unless otherwise specifically limited.

There are needs to improve electromagnetic shielding performance.

In the existing technologies, a magnetic field shielding layer is usually formed by a sputtering process. A semiconductor packaging structure usually has a large thickness and a rectangular shape. Correspondingly, the semiconductor packaging structure usually has multiple apex angles and steep sidewalls. When forming the magnetic field shielding layer to cover the semiconductor packaging structure by the sputtering process, a thickness of the formed magnetic field shielding layer may be inhomogeneous and edges of the semiconductor packaging structure may not be covered. It may be difficult to guarantee the shielding performance of the magnetic field shielding layer.

The present disclosure provides a packaging structure and its fabrication method to at least partially alleviate the above problems. The fabrication method may include: after adhering a first plastic encapsulation layer on functional surfaces of semiconductor chips to a carrier plate, forming a first shielding layer to cover non-functional surfaces and sidewalls of the semiconductor chips; forming a second shielding layer on the first shielding layer; forming a second plastic encapsulation layer on the second shielding layer and a portion of the carrier plate between the semiconductor chips; peeling off the carrier plate to form a pre-packaging plate, a backside of which exposes the first plastic encapsulation layers; removing a portion of the first plastic encapsulation layer to expose metal bumps; and forming external contact structures connected to the metal bumps on the backside of the pre-packaging plate. By forming the second shielding layer on the first shielding layer, the second shielding layer may cover a portion of the first shielding layer with an uneven thickness and poor edge coverage, thereby making an overall shield layer formed by the first shielding layer and the second shielding layer complete, to improve shielding performance.

One embodiment of the present disclosure provides a fabrication method for forming a packaging structure, as illustrated in FIGS. 1-13.

Figure 2:

As illustrated in FIGS. 1-5 where FIG. 2 is a cross-section view along an AB direction in FIG. 1. Semiconductor chips 101 may be provided. Each semiconductor chip 101 may include a functional surface and a non-functional surface opposite to the functional surface. Soldering pads 102 may be disposed on the functional surface and a metal bump 103 may be formed on each soldering pad 102, in each semiconductor chip 101. A first plastic encapsulation layer 132 may be formed on functional surfaces of the semiconductor chips 101 to cover metal bumps 130.

In each semiconductor chip, integrated circuits (not shown in the figures) may be formed on the functional surface, and the soldering pads 102 may be disposed on the functional surface. The soldering pads 102 may be electrically connected to the integrated circuits in the semiconductor chip 101 and may be used as terminals for electrically connecting the integrated circuits in the semiconductor chip 101 to external circuits.

In each semiconductor chip 101, the functional surface may be a surface for forming the integrated circuits and the non-functional surface may be a surface opposite to the functional surface, while surrounding surfaces between the functional surface and the non-functional surface may be sidewalls of the semiconductor chip 101.

Figure 3:
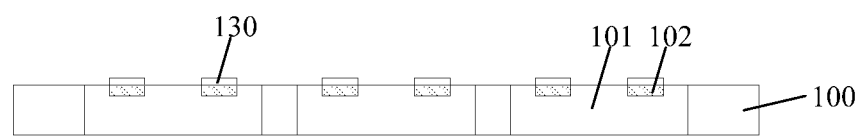
Figure 4:
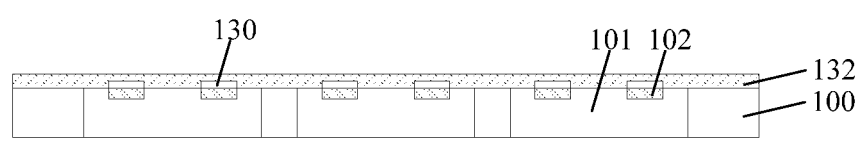
Figure 5:

The semiconductor chips 101 may be formed by a semiconductor integration manufacturing process. As illustrated in FIGS. 1-2, a wafer 100 may be provided. The wafer 100 may include chip areas arranged in rows and columns, and cutting path areas between the chip areas. The semiconductor chips 101 may be formed correspondingly in the chip areas of the wafer 100. The soldering pads 102 may be formed on the functional surface of each of the semiconductor chips 101. As illustrated in FIG. 3, a metal bump 130 may be formed on each of the soldering pads 102 on the functional surface of each of the semiconductor chips 101. Metal bumps 103 may be made of aluminum, nickel, tin, tungsten, platinum, copper, titanium, chromium, tantalum, gold, silver, or a combination thereof. The metal bumps 103 may be formed by an electrical plating process, a sputtering process, or a physical vapor deposition process. Each metal bump 103 may raise a corresponding one of the soldering pads 102 to facilitate subsequently wiring, and may also protect the corresponding one of the soldering pads 102 and conduct heat. As illustrated in FIG. 4, the first plastic encapsulation layer 132 may be formed on a surface of the wafer 100 (on the functional surfaces of the semiconductor chips 101) to cover the metal bumps 130. The first plastic encapsulation layer 132 may be formed by an injection molding process or a transfer molding process, and may be made of a material including a resin. The resin may include epoxy resin, polyimide resin, benzocyclobutene resin, polybenzoxazole resin, or a combination thereof. As illustrated in FIG. 5, the wafer 100 may be cut along the cutting path to form the discrete semiconductor chips 101.

In the present embodiment, before cutting the wafer 100, the first plastic encapsulation layer 132 may be formed. When performing the injection molding process or transfer molding process, the wafer may not move in a mold of an injection molding device or a transfer molding device, and the formed first plastic encapsulation layer 132 may have a flat surface, therefore. After cutting the wafer 100, the first plastic encapsulation layer 132 on the semiconductor chips 101 may be adhered to the carrier plate. Since the formed first plastic encapsulation layer 132 may have a flat surface, each of the semiconductor chips 101 and the carrier plate may have a high adhesion. Without forming the first plastic encapsulation layer, some of the semiconductor chips formed by cutting the wafer may have uneven surfaces and height of the metal bumps at different positions may be different. By forming the first plastic encapsulation layer, when forming a second plastic encapsulation layer covering the semiconductor chips 101 on the carrier plate subsequently, insufficient adhesion between some of the semiconductor chips 101 and the carrier plate, and displacement of some of the semiconductor chips under impact of pressure in the injection or transfer molding processes may be prevented. Therefore, when forming a rewiring layer subsequently, connecting positions between the rewiring layer and the corresponding soldering pads may be prevented from shifting and influence on the connecting performance between the rewiring layer and the corresponding soldering pads may be avoided. Correspondingly, stability and reliability of the packaging structure may be improved.

In one embodiment, the wafer 100 may be made of a material including single-crystalline silicon, single-crystalline germanium, GeSi, SiC, silicon on an insulator (SOI), germanium on an insulator (GOI), or other materials including III-V compounds such as GaAs.

In one embodiment, integrated circuits in the semiconductor chips 101 may include semiconductor devices (such as transistors, memories, or diodes) and/or interconnection structures connecting the semiconductor devices (such as metal wires or metal plugs).

In one embodiment, the semiconductor chips may be semiconductor chips requiring electromagnetic shielding.

Figure 6:
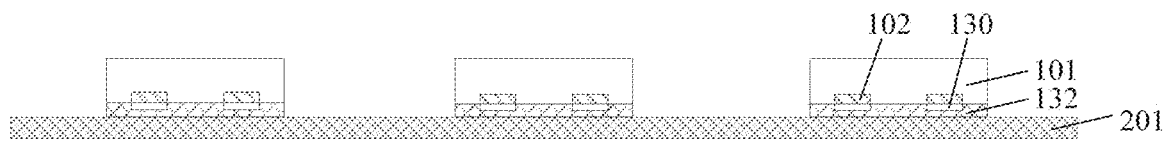

As illustrated in FIG. 6, a carrier plate 201 may be provided and the first plastic encapsulation layer 132 on the functional surfaces of the semiconductor chips 101 may be adhered to the carrier plate 210.

The carrier plate 201 may provide a support platform for subsequent processes. In one embodiment, the carrier plate 210 may be a glass carrier plate, a silicon carrier plate, or a metal carrier plate. In some other embodiments, the carrier plate 210 may be a carrier plate made of other suitable materials.

The first plastic encapsulation layer 132 on the functional surfaces of the semiconductor chips 101 may be adhered to the carrier plate 210 through an adhesive layer, and the functional surfaces of the semiconductor chips 101 (or the soldering pads 102) may face an adhesive surface of the carrier plate 201.

The adhesive layer may be made of any suitable material. In one embodiment, the adhesive layer may be made of UV glue. The UV glue may be an adhesive material that can react to ultraviolet light with a special wavelength. The UV glue may include two types according to change in its viscosity after ultraviolet light irradiation. One type of the UV glue may be a UV curing glue. A photoinitiator or photosensitizer of a material of the UV curing glue may absorb the ultraviolet light under ultraviolet radiation to generate active radicals or cations. Correspondingly, monomer polymerization, cross-linking, or grafting chemical reactions may be initiated to make the UV curing glue change from liquid to solid in a few seconds, thereby bonding the UV curving glue with a surface of an object in contact with the UV curing glue. Another type of the UV glue may have a high viscosity when not exposed to the ultraviolet irradiation. After the ultraviolet irradiation, crosslinking chemical bonds in a material of the UV glue may be broken, resulting in a significant decrease or disappearance of the viscosity. In one embodiment, the UV glue in the adhesive layer may be the latter, and may be formed by a film sticking process, a glue printing process, or a rolling glue process.

In some other embodiments, the adhesive layer may be made of a material including epoxy glue, polyimide glue, polyethylene glue, benzocyclobutene glue, or polybenzoxazole glue.

The semiconductor chips 201 may be adhered to the carrier plate 201 evenly in rows and columns.

Figure 7:
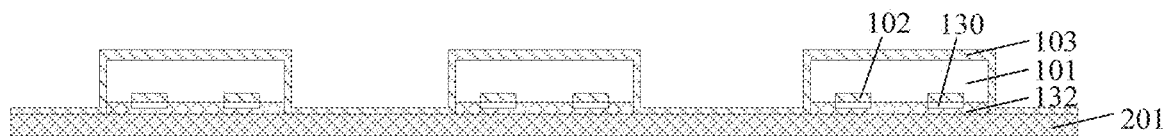

As illustrated in FIG. 7, a first shielding layer 103 may be formed to cover the non-functional surfaces and the sidewalls of the semiconductor chips 101.

In one embodiment, the first shielding layer 103 may cover the non-functional surfaces and the sidewalls of the semiconductor chips 101, and also cover surfaces of a portion of the carrier plate 201 between the semiconductor chips 101. In some other embodiments, the first shielding layer 103 may cover the non-functional surfaces and the sidewalls of the semiconductor chips 101 only. In other embodiments, the first shielding layer 103 may further cover sidewalls of the first plastic encapsulation layer 132.

In one embodiment, a thickness of the first shielding layer 103 may equal to a thickness of the first plastic encapsulation layer on top surfaces of the metal bumps 130. Subsequently, a portion of the first plastic encapsulation layer may be removed by polishing to expose the metal bumps, and a portion of the first shielding layer between the semiconductor chips may be removed simultaneously. Correspondingly, the top surfaces of the metal bumps may be flush with a surface of the second encapsulation layer, the surface of the remaining first encapsulation layer, a bottom surface of the first shielding layer, and a bottom surface of a second shielding layer. In other embodiments, the thickness of the first shielding layer 103 may be any other suitable value.

In one embodiment, the first shielding layer may be formed by a sputtering process, and may be made of a material including copper, tungsten, or aluminum. Since each of the semiconductor chips 101 may have four apex angles (at right angles), a large thickness, and steep sidewalls (angles between the sidewalls and the surface of the carrier plate 201 may be 90 degrees), the first shielding layer 103 formed by the sputtering process may have problems of uneven thickness and poor edge coverage.

In one embodiment, the formed first shielding layer 103 may be a shielding layer for electric field and magnetic field, and may be used for shielding the electric field and the magnetic field. The second shielding layer formed subsequently may also be a shielding layer for the electric field and the magnetic field, and may be used for shielding the electric field and the magnetic field.

A shielding layer may be needed to shielding the electric field and the magnetic field. An existing single-layer shielding layer with a specific material or an existing shielding layer including multilayer same or similar materials may only have a good shielding effect for the electric field, and have a weak shielding effect for the magnetic field. The shielding performance may be poor. In some other embodiments, the first shielding layer 103 may be a shielding layer for the magnetic field, and may be used for shielding the magnetic field. The second shielding layer formed subsequently may be a shielding layer for the electric field, and may be used for shielding the electric field. In some other embodiments, the first shielding layer 103 may be a shielding layer for the electric field, and may be used for shielding the electric field. The second shielding layer formed subsequently may be a shielding layer for the magnetic field, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the first shielding layer 103 is the electric field shielding layer, the first shield layer 103 (the electric field shielding layer) may be made of a material including copper, tungsten, or aluminum. When the first shielding layer 103 is a magnetic field shielding layer, the first shield layer 103 (the magnetic field shielding layer) may be made of a material including CoFeB alloy, CoFeTa, NiFe, Co, CoFe, CoPt, or Ni—Co—Fe alloy. The first shielding layer 103 may be formed by a sputtering process, a physical vapor deposition process, an atomic layer deposition process, a chemical vapor deposition process, or any other suitable processes.

Figure 8:
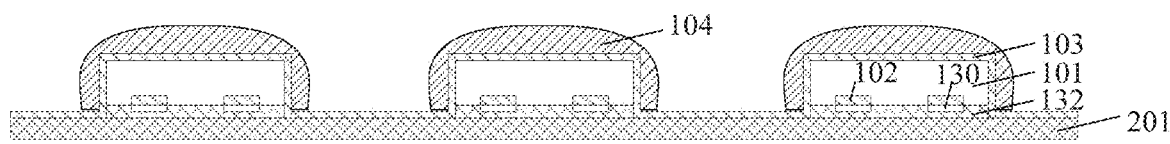

As illustrated in FIG. 8, a second shielding layer 104 may be formed on the first shielding layer 103.

By forming the second shielding layer 104 on the first shielding layer 103, the second shielding layer 104 may cover a portion of the first shielding layer 103 with the uneven thickness and poor edge coverage. Correspondingly, the overall shielding layer constituted by the first shielding layer 103 and the second shielding layer 104 may be complete, improving the shielding performance.

In one embodiment, the second shielding layer 104 may be only located on a portion of the surface of the first shielding layer 103 on the non-functional surfaces and the sidewalls of the semiconductor chips 101. A surface of the second shielding layer 104 may be ellipsoidal. The second shielding layer 104 may be formed by a selective plating process, a dispensing process or a mesh printing process, so that the formed second shielding layer 104 can better cover the first shielding layer and prevent the second shielding layer 104 from forming areas with poor coverage. Correspondingly, the integrity of the overall shield layer formed by both the first shield layer 103 and the second shield layer 104 may be further ensured, and the subsequent removal of the semiconductor chips may not need additional masking and etching processes.

In one embodiment, the second shielding layer 104 may be made of a material including copper, solder, or conductive silver paste. In one embodiment, the second shielding layer 104 may be formed by: forming a mask layer (not shown in the figures) on the carrier plate 201 where the mask layer includes openings exposing the portion of the first shielding layer 103 on the non-functional surfaces and the sidewalls of the semiconductor chips 101; forming the second shielding layer 104 in the openings by using the first shielding layer as a conductive layer in the plating process to electroplate, or brushing the solder into the openings to form the second shielding layer 104 directly; and removing the mask layer.

In another embodiment, the second shielding layer 104 may be made of solder or conductive silver paste, and may be formed by the dispensing process or the mesh printing process correspondingly. When performing the dispensing process, the solder or the conductive silver paste may be applied on a surface of the portion of the first shielding layer 103 on the non-functional surfaces and the sidewalls of the semiconductor chips 101. When performing the mesh printing process, a portion of the first shielding layer 103 on a portion of the carrier plate 201 around the semiconductor chips 101, and correspondingly a remaining portion of the first shielding layer 103 may cover the non-functional surfaces and the sidewalls of the semiconductor chips 101, and side surfaces of a underfill layer. The remaining portion of the first shielding layer 103 may further extend to partially cover the surface of the portion of the carrier plate 201 around the semiconductor chips 101. Then a mesh plate with meshes may be placed on the carrier plate 201 and each of the semiconductor chips may be placed in a correspondingly mesh in the mesh plate. Subsequently, the solder may be brushed into the meshes and the solder may cover the surface of the portion of the first shielding layer 103 on the non-functional surfaces and the sidewalls of the semiconductor chips 101. Then the mesh plate may be removed and the solder may be reflowed to form the second shielding layer 104.

In one embodiment, the solder may be a metal including tin, tin-silver, tin-lead, tin-silver copper, tin silver-zinc, tin zinc, tin bismuth indium, tin indium, tin gold, tin copper, tin zinc indium, tin-silver antimony, or a combination thereof.

In some other embodiments, the first shielding layer 103 may be a shielding layer for the magnetic field, and the second shielding layer 104 may be a shielding layer for the electric field. In some other embodiments, the first shielding layer 103 may be a shielding layer for the electric field, and may be used for shielding the electric field. The second shielding layer 104 may be a shielding layer for the magnetic field, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the second shielding layer 104 is the electric field shielding layer, the second shielding layer 104 (the electric field shielding layer) may be made of a material including copper, tungsten, or aluminum. When the second shielding layer 104 is a magnetic field shielding layer, the second shielding layer 104 (the magnetic field shielding layer) may be made of a material including CoFeB alloy, CoFeTa, NiFe, Co, CoFe, CoPt, or Ni—Co—Fe alloy. The second shielding layer 104 may be formed by a sputtering process, a physical vapor deposition process, an atomic layer deposition process, a chemical vapor deposition process, or any other suitable processes.

In one embodiment, after forming the second shielding layer 104, a portion of the first shielding layer 103 on the portion of the carrier plate between the semiconductor chips 101 may be removed by etching.

Figure 9:
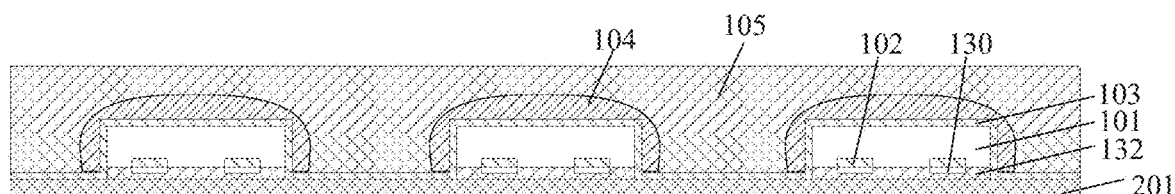

As illustrated in FIG. 9, a second plastic encapsulation layer 105 may be formed on the second shielding layer 104 and on the portion of the carrier plate 201 between the semiconductor chips 101.

The second plastic encapsulation layer 105 may encapsulate and fix the semiconductor chips 101, for forming a pre-packaging plate subsequently.

The second plastic encapsulation layer 105 may be made of a material including epoxy resin, polyimide resin, benzocyclobutene resin, polybenzoxazole resin, polybutylene terephthalate, polycarbonate, polyethylene terephthalate, polyethylene, Polypropylene, polyolefin, polyurethane, polyolefin, polyethersulfone, polyamide, polyurethane, ethylene-vinyl acetate copolymer, polyvinyl alcohol, or a combination thereof.

The second plastic encapsulation layer 105 may be formed by an injection molding process, a transfer molding process, or any other suitable processes.

Figure 10:
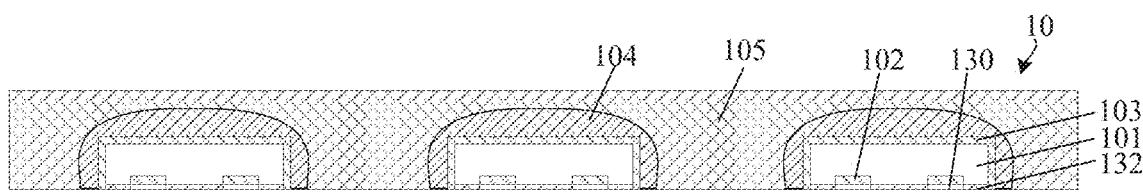

As illustrated in FIG. 10, the carrier plate 201 may be peeled off to form the pre-packaging plate 10, and a portion of the first plastic encapsulation layer 132 may be removed to expose the metal bumps 130.

The adhesive layer may be removed by a process including chemical etching, mechanical peeling, CMP, mechanical grinding, or hot baking, to peel off the carrier plate 201.

A portion of the first plastic encapsulation layer 132 may be removed by a polishing process, to expose the metal bumps 130. The polishing process may include a chemical mechanical polishing process.

In one embodiment, when removing the portion of the first plastic encapsulation layer 132 by the polishing process to expose the metal bumps 130, the portion of the first shielding layer 103 between the semiconductor chips 101 may be removed simultaneously, to make the top surfaces of the metal bumps flush with the surface of the second encapsulation layer 105, the surface of the remaining first encapsulation layer 132, a bottom surface of the first shielding layer 103, and a bottom surface of a second shielding layer 104.

Figure 11:
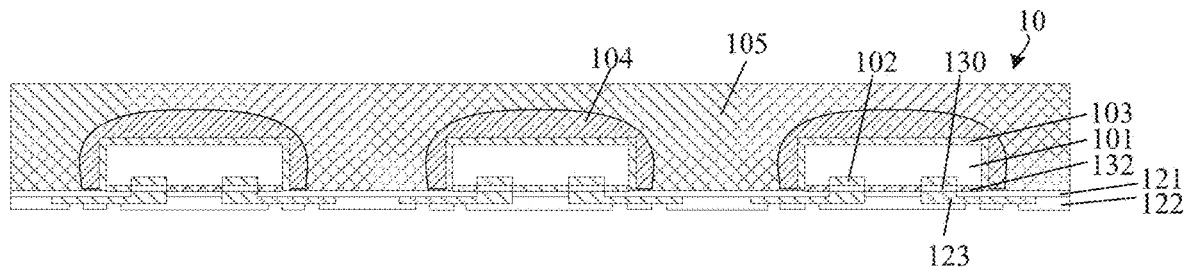
Figure 12:
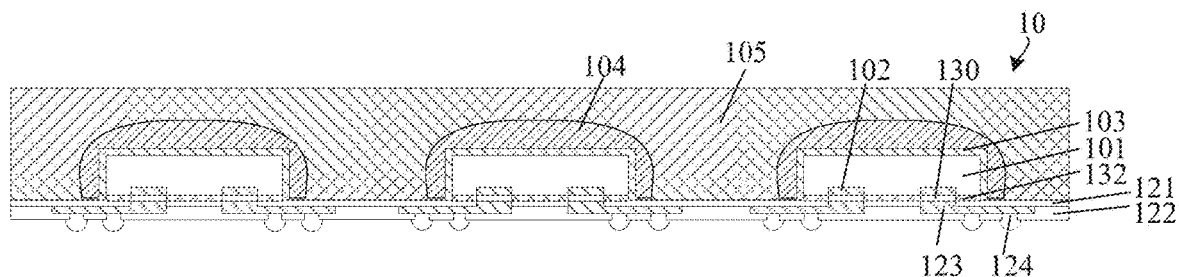

As illustrated in FIGS. 11-12, for each metal bump 130, an external contact structure connected to the metal bump 130 may be formed on the first plastic encapsulation layer 132.

In one embodiment, each external contact structure may include a rewiring layer 123 connected to a corresponding metal bump 130 and external contact parts 124 on and connected to the rewiring layer 123. Each metal bump 130 on each of the semiconductor chips 101 may be connected to corresponding external contact parts 124.

In one embodiment, rewiring layers 123 and external contact parts 124 in external contact structures of the semiconductor chips 101 may be formed by: forming an insulating layer (a first insulating layer) 121 on a backside of the pre-packaging plate 10 where the insulating layer (the first insulating layer) 121 includes openings exposing the metal bumps 130; forming a rewiring layer 123 in each opening and on a surface of a portion of the insulating layer (the first insulating layer) 121; and forming the external contact parts 124 on a portion of each rewiring layer 123 outside a corresponding opening. The insulating layer (the first insulating layer) 121 may be made of a material including SiN, silicon-boron glass, silicon-phosphor glass, silicon-boron-phosphor glass, or a combination thereof. In one embodiment, each external contact part 123 may be a soldering ball or include a metal post and a soldering ball on the soldering post. The external contact parts 123 may be formed by: forming a second insulating layer 122 on the first insulating layer 121 and on the rewiring layers 123, where the second insulating layer 122 may include second openings exposing a portion of a surface of each rewiring layer 123 on the surface of the first insulating layer 121; and forming the external contact parts 124 in the second openings.

In one embodiment, the conductive contact structures may be further formed on the first insulating layer 121 to electrically connect the first shielding layer 103 to a portion of the rewiring layers 123. Correspondingly, the shielding layer may discharge through the portion of the rewiring layers 123 or block external static electrical interference.

Figure 13:
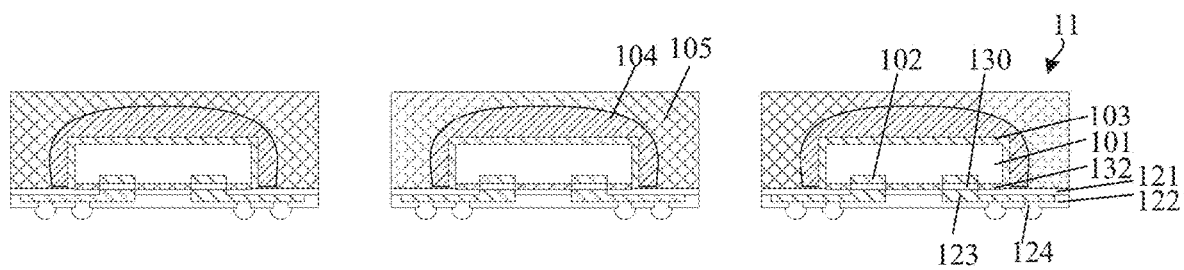

As illustrated in FIGS. 12-13, after forming the external contact structures, the pre-packaging plate may be cut to form discrete packaging structures 11.

As illustrated in FIG. 13, each packaging structure of the discrete packaging structures 11 may include the second plastic encapsulation layer 105, and a semiconductor chip 101 of the semiconductor chips 101 embedded in the second plastic encapsulation layer 105. The semiconductor chip 101 may include a functional surface and a non-functional surface opposite to the functional surface. A soldering pads 102 may be disposed on the functional surface and a metal bump 103 may be formed on each of the soldering pads 102. The second plastic encapsulation layer 105 may expose metal bumps on the soldering pads 102. The packaging structure 11 may further include a first plastic encapsulation layer 132 on the functional surface to cover sidewalls of the metal bumps 130 and expose the top surfaces of the metal bumps 130. A bottom surface of the first plastic encapsulation layer 132 may be flush with a bottom surface of the second plastic encapsulation layer 105. The packaging structure 11 may further include the first shielding layer 103 and the second shielding layer 104 between the semiconductor chip 101 and the second plastic encapsulation layer 105, and between the first plastic encapsulation layer 132 and the second plastic encapsulation layer 105. The first shielding layer 132 may cover the non-functional surface and the sidewalls of the semiconductor chip 101, and the sidewalls of the first plastic encapsulation layer 132. The second shielding layer 104 may be disposed between the first shielding layer 103 and the second plastic encapsulation layer 105, and may completely cover a surface of a portion of the first shielding layer 103 on the non-functional surface and the sidewalls of the semiconductor chip 101, and on the sides of the first plastic encapsulation layer 132.

The packaging structure 11 may further include external contact structures connected to the soldering pads 101 on the first plastic encapsulation layer 132.

Each external contact structure may include a rewiring layer 123 on the backside of the pre-packaging plate 10 and electrically connected to a corresponding metal bump 130, and external contact parts 124 on the rewiring layer and electrically connected to the rewiring layer 123.

In the present disclosure, massive production of the packaging structure 11 with the first shielding layer 103 and the second shielding layer 104 may be achieved by the above semiconductor integration fabrication process. Producing efficiency may be improved.

The present disclosure also provides another fabrication method for forming a packaging structure. FIGS. 14-20 illustrate semiconductor structures corresponding to different stages in the fabrication method for forming a packaging structure. In comparison to the previous fabrication method, in the present method, a bottom shielding layer may be formed on the functional surfaces of the semiconductor chips. The bottom shielding layer may completely cover the functional surfaces of the semiconductor chips, and have surrounding edges flush with surrounding sidewalls of the semiconductor chips. The soldering pads may penetrate through the bottom shielding layer, and may be separated from the bottom shielding layer through isolation layers. When forming the first shielding layer, the first shielding layer may be connected to the surrounding edges of the bottom shielding layer. In the present method, the second shielding layer may be formed on the first shielding layer after forming the first shielding layer. By forming the second shielding layer on the first shielding layer, the second shielding layer may cover areas of the first shielding layer with an uneven thickness and poor edge coverage, thereby making an overall shield layer formed by the first shielding layer and the second shielding layer complete, to improve shielding performance. Further, the bottom shielding layer may be formed on the functional surfaces of the semiconductor chips, and when forming the first shielding layer, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

Figure 14:
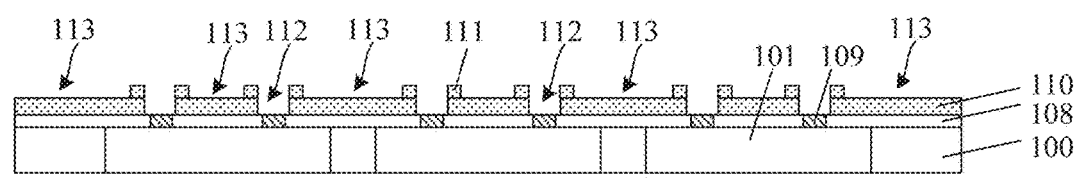
FIGS. 14-20 illustrate structures corresponding to certain stages in another exemplary fabrication method for forming a packaging structure according to various disclosed embodiments of the present disclosure.

The semiconductor chips with the bottom shielding layer may be formed by the following processes. As illustrated in FIG. 14, semiconductor chips 101 on a wafer 100 may be provided. Each semiconductor chip 101 of the semiconductor chips 101 may include a top dielectric layer 108 and a top interconnection structure 109 in the top dielectric layer 108. The semiconductor chip 101 may further include semiconductor devices (such as transistors) formed on a surface of the wafer 100 (or on a semiconductor substrate), interlayer dielectric layers between the top dielectric layer 108 and the surface of the wafer 100. Each of the interlayer dielectric layers may include a corresponding interconnection structure. Interconnection structures in the interlayer dielectric layers may connect upper or lower layers, or electrically connected to the semiconductor devices. The top interconnection structure 109 in the top dielectric layer 108 may be electrically connected to an interconnection structure in an adjacent interlayer dielectric layer of the interlayer dielectric layers.

Subsequently, an isolation layer may be formed on each top dielectric layer 108.

In one embodiment, each isolation layer may have a multilayer structure, and may include a first isolation layer 110 and a second isolation layer 111 on the first isolation layer 110. The first isolation 110 and the second isolation layer 111 may be made of different materials. The first isolation 110 and the second isolation layer 111 may be made of one of $SiO_2$, SiN, or SiNO respectively, to achieve precise control of depth of second openings formed subsequently. Correspondingly, when forming the second openings, an excessive etching of the isolation layer which may induce exposing of a portion of a surface of the top interconnection structure 109 on the top dielectric layer 108 by the second openings and short circuits between top interconnection structures 109 when forming the bottom shielding layer in the second openings, may be prevented.

In some other embodiments, each isolation layer may have a single-layer structure.

Figure 15:
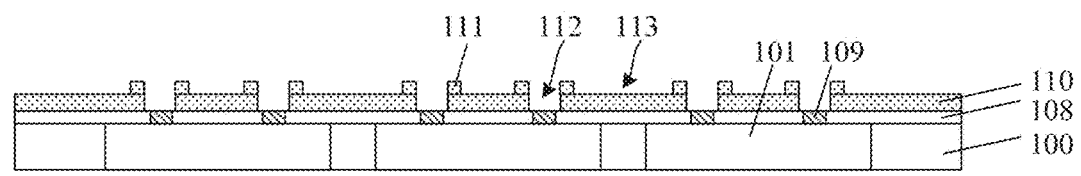

As illustrated in FIG. 15, the isolation layers may be etched to form first openings 112 and second openings 113 surrounding the first openings 112. A remaining portion of the isolation layers may be only located between the first openings 112 and the second openings 113, to separate the first openings 112 from the second openings 113.

The first openings 112 may be discrete and penetrate through the isolation layers 111. Each first opening 112 may expose a portion of a surface of a corresponding interconnection structure 109. The first openings 112 may be filled with metal to form the soldering pads.

Each second opening 113 may surround a corresponding first opening 112, and may be separated from the corresponding first opening 112 through the isolation layers 111. Each second opening 113 may have a depth smaller than a thickness of the isolation layer. All areas outside the first openings 112 and outside the isolation layer 111 surrounding the first openings 112 may correspond to areas of the second openings 113. The second openings 113 may be connected. When forming the bottom shielding layer in the second openings 113, the bottom shielding layer may cover all areas of the functional surfaces of the semiconductor chips 101 except for the soldering pads (formed in the first openings 112) and the isolation layer surrounding the soldering pads. When forming the first shielding layer on the non-functional surfaces and the sidewalls of the semiconductor chips 101, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

In one embodiment, the second isolation layers 111 may be etched using a first etch process with the first isolation layers 110 as a stop layer, to form the second openings in the second isolation layers 111. Subsequently, the second isolation layers 111 and the first isolation layers 110 may be etched using a second etch process, to form the first openings in the second isolation layers 111 and the first isolation layers 110. Before the first and the second etch processes, a corresponding mask layer may be formed on the second isolation layers. In some other embodiment, the second etch process may be performed before the first etch process.

In some other embodiments, each isolation layer may have a single-layer structure, and the first openings and the second openings may be formed by two etch processes respectively. Depth of the second openings may be controlled by controlling the etch time of the etch process (the depth of the second openings may be smaller than the thickness of the isolation layers).

Figure 16:
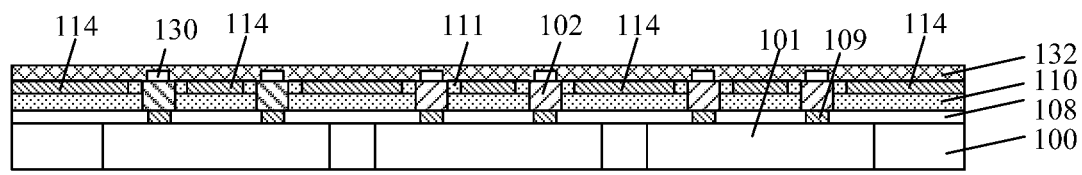
Figure 17:
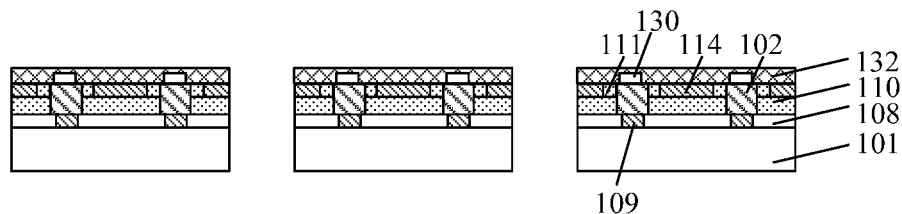

As illustrated in FIG. 16, a soldering pad 102 may be formed in each first opening by filling the first opening with metal, and the bottom shielding layer 114 may be formed in the second openings by filling the second openings with metal. A metal bump 130 may be formed on each soldering pad 102. A first encapsulation layer 132 may be formed covering metal bumps 130 and the bottom shielding layer 114. As illustrated in FIG. 17, after forming the first encapsulation layer 132, the wafer 100 may be cut to form the discrete semiconductor chips 101 with the bottom shielding layer 114.

In some embodiments, soldering pads 102 and the bottom shielding layer 114 may be formed by a same process including: forming a metal material layer in the first openings, in the second openings, and on the isolation layers by a physical vapor deposition process, a sputtering process, or a plating process; planarizing the metal material layer to remove a portion of the metal material layer higher than the surfaces of the isolation layers and form a soldering pad in each first opening and the bottom shielding layer 114 in the second openings. The metal material layer may be made of a material including aluminum, nickel, tin, tungsten, platinum, copper, titanium, chromium, tantalum, gold, silver, or a combination thereof.

Figure 18:
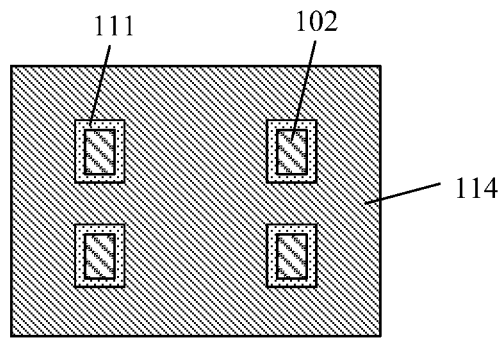

As illustrated in FIG. 18 which is a top view of the soldering pads 102 and the bottom shielding layer 104 in FIG. 17, each semiconductor chip 101 of the discrete semiconductor chip 101 may include the bottom shielding layer 114 on the functional surface, and the bottom shielding layer 114 may cover the whole functional surface of the semiconductor chip 101. The surrounding edges of the bottom shielding layer 114 may be flush with the surrounding sidewalls of the semiconductor chip 101. The soldering pads 102 may penetrate through the bottom shielding layer and may be isolated from the bottom shielding layer 114 by the isolation layers 111.

In the present embodiment, the process for forming the bottom shielding layer 114 may be integrated in the existing fabrication processes of the semiconductor chips, and may be performed synchronically with the process for forming the soldering pads 102. The fabrication process may be simplified and the process difficulty may be reduced, to improve the efficiency.

Figure 19:
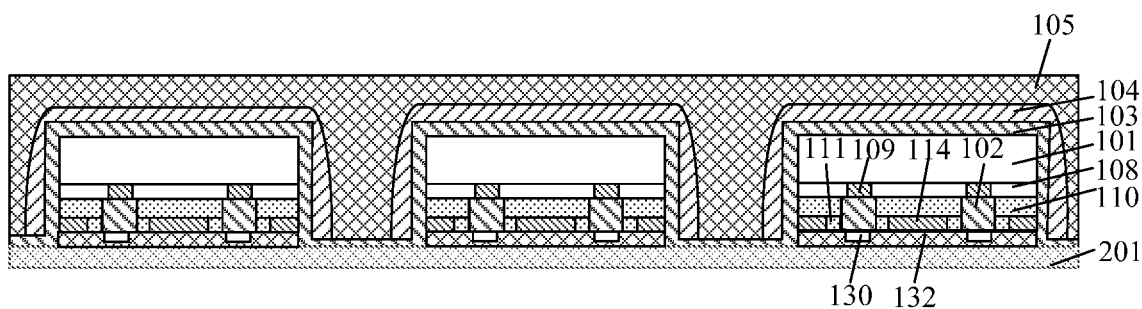

As illustrated in FIG. 19, the semiconductor chips 101 with the first plastic encapsulation layer 132 may be adhered to the carrier plate 201, and the first plastic encapsulation layer 132 may be in contact with the carrier plate 201. The first shielding layer 103 may be formed to cover the non-functional surfaces and the sidewalls of the semiconductor chips 101, and the second shielding layer 104 may be formed on the first shielding layer 103. The second plastic encapsulation layer 105 may be formed on the second shielding layer 104 and on a portion of the carrier plate 201 between the semiconductor chips 101.

Figure 20:
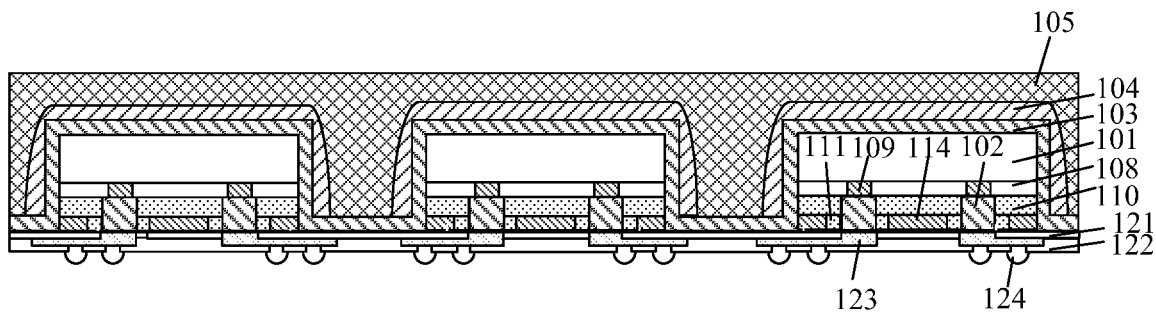

As illustrated in FIG. 20, the carrier plate 201 may be peeled off to form the pre-packaging plate 10, and a portion of the first plastic encapsulation layer 132 may be removed to expose the metal bumps 130. For each metal bump 130, an external contact structure connected to the metal bump 130 may be formed on the first plastic encapsulation layer 132. Each external contact structure may include a rewiring layer 123 connected to a corresponding metal bump 130 and external contact parts 124 on and connected to the rewiring layer 123.

It should be noted that other definitions or descriptions of the same or similar structures in the present embodiment as in the previous embodiments will not be repeated. For details, please refer to the definitions or descriptions of the corresponding parts in the previous embodiments.

The present disclosure also provides a packaging structure. As illustrated in FIG. 11 and FIG. 20, the packaging structure may include:

a pre-packaging plate 10, a second plastic encapsulation layer 105 in the pre-packaging structure 10, semiconductor chips 101 surrounded by the second plastic encapsulation layer 105 where each semiconductor chip 101 may include a functional surface and a non-functional surface opposite to the functional surface, soldering pads 102 on the functional surfaces of the semiconductor chips 101 where the second plastic encapsulation layer 105 may expose the soldering pads 102, metal bumps 130 on the soldering pads 102, a first plastic encapsulation layer 132 on the functional surfaces covering sidewalls of the metal bumps 132 and exposing top surfaces of the metal bumps, a first shielding layer 103 and a second shielding layer 104 between the semiconductor chips 101 and the first plastic encapsulation layer 132 and between the first plastic encapsulation layer 132 and the second plastic encapsulation layer 105, and external contact structures on the first plastic encapsulation layer 132 and connected to the metal bumps 130.

A bottom surface of the first plastic encapsulation layer 132 may be flush with a bottom surface of the second plastic encapsulation layer 105. The first shielding layer 103 may surround non-functional surfaces and sidewalls of the semiconductor chips 101, and sidewalls of the first plastic encapsulation layer 132. The second shielding layer 104 may be disposed between the first shielding layer 103 and the second plastic encapsulation layer 105, and may completely cover a surface of the first shielding layer 103 on the non-functional surfaces and sidewalls of the semiconductor chips 101, and on the sidewalls of the first plastic encapsulation layer 132.

In one embodiment, the first shielding layer 103 may be formed by a sputtering process, and the second shielding layer 104 may be formed by a selective plating process, a dispensing process or a mesh printing process. The first shielding layer 103 may be made of a material including copper, tungsten, aluminum, or a combination thereof. The second shielding layer 104 may be made of a material including copper, solder, or conductive silver paste.

In some other embodiments, the first shielding layer 103 may be a shielding layer for the magnetic field, and the second shielding layer 104 may be a shielding layer for the electric field. In some other embodiments, the first shielding layer 103 may be a shielding layer for the electric field, and may be used for shielding the electric field. The second shielding layer 104 may be a shielding layer for the magnetic field, and may be used for shielding the magnetic field. The electric field shielding layer may be made of a material including copper, tungsten, or aluminum. The magnetic field shielding layer may be made of a material including CoFeB alloy, CoFeTa, NiFe, Co, CoFe, CoPt, or Ni—Co—Fe alloy.

In some embodiments, as illustrated in FIG. 20, the packaging structure may further include a bottom shielding layer 114 on the functional surfaces of the semiconductor chips 101. The bottom shielding layer 114 may cover the whole functional surfaces of the semiconductor chips 101, and may have surrounding edges flush with the sidewalls of the semiconductor chips 101. The soldering pads 102 may penetrate through the bottom shielding layer 114, and may be isolated from the bottom shielding layer 114 through isolation layers 111. The first plastic encapsulation layer 132 may cover the bottom shielding layer 114. The first shielding layer 103 may be connected to surrounding edges of the bottom shielding layer 114.

In one embodiment, each external contact structure may include a rewiring layer 123 on a backside of the pre-packaging plate and connected to a corresponding soldering pad 102, and an external contact part 124 on and connected to the rewiring layer 123.

The pre-packaging plate may include a first insulating layer 121 on the backside of the pre-packaging plate. The first insulating layer 121 may include openings exposing surfaces of the soldering pads 102. Each rewiring layer 123 may be located in a corresponding opening and on a portion of the first insulating layer 121, and each external contact part 124 may be located on a surface of a corresponding rewiring layer 123 outside a corresponding opening.

The packaging structure may further include a second insulating layer 122 covering the first insulating layer 121. A portion of each external contact part 124 may be located in the second insulating layer 122.

In some embodiments, the packaging structure may further include a conductive contact structure (not shown in the figures) in the first insulating layer 121 and electrically connected the first shielding layer 103 to a portion of a corresponding rewiring layer 123.

The present disclosure also provides another fabrication method for forming a packaging structure, as illustrated in FIGS. 21-33.

Figure 21:
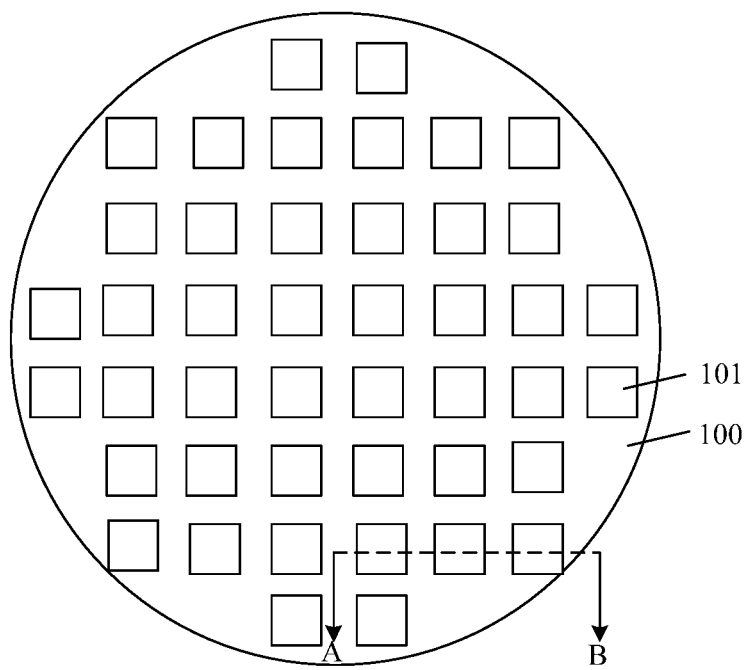
FIGS. 21-33 illustrate structures corresponding to certain stages in another exemplary fabrication method for forming a packaging structure according to various disclosed embodiments of the present disclosure.
Figure 22:
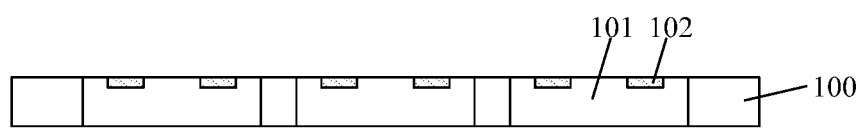
Figure 23:
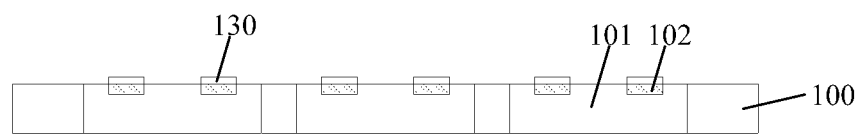

As illustrated in FIGS. 21-25 where FIG. 22 is a cross-section view along an A'B' direction in FIG. 21. Semiconductor chips 101 may be provided. Each semiconductor chip 101 may include a functional surface and a non-functional surface opposite to the functional surface. Soldering pads 102 may be disposed on the functional surface and a metal bump 103 may be formed on each soldering pad 102, in each semiconductor chip 101. A first plastic encapsulation layer 132 may be formed on functional surfaces of the semiconductor chips 101 to cover metal bumps 130 on the semiconductor chips 101.

In each semiconductor chip 101, integrated circuits (not shown in the figures) may be formed on the functional surface, and the soldering pads 102 may be disposed on the functional surface. The soldering pads 102 may be electrically connected to the integrated circuits in the semiconductor chip 101 and may be used as terminals for electrically connecting the integrated circuits in the semiconductor chip 101 to external circuits.

In each semiconductor chip 101, the functional surface may be a surface for forming the integrated circuits and the non-functional surface may be a surface opposite to the functional surface, while surrounding surfaces between the functional surface and the non-functional surface may be sidewalls of the semiconductor chip 101.

Figure 24:
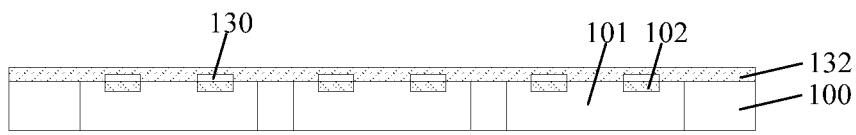
Figure 25:
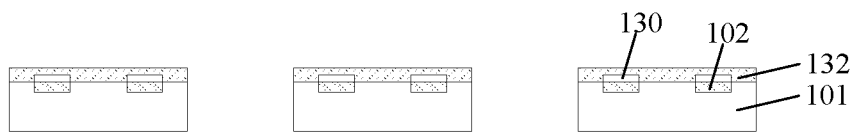

The semiconductor chips 101 may be formed by a semiconductor integration manufacturing process. As illustrated in FIGS. 21-22, a wafer 100 may be provided. The wafer 100 may include chip areas arranged in rows and columns, and cutting path areas between the chip areas. The semiconductor chips 101 may be formed correspondingly in the chip areas of the wafer 100. The soldering pads 102 may be formed on the functional surface of each of the semiconductor chips 101. As illustrated in FIG. 3, one metal bump 130 may be formed on each of the soldering pads 102 on the functional surface of each of the semiconductor chips 101. The metal bumps 103 may be made of aluminum, nickel, tin, tungsten, platinum, copper, titanium, chromium, tantalum, gold, silver, or a combination thereof. The metal bumps 103 may be formed by an electrical plating process, a sputtering process, or a physical vapor deposition process. Each metal bump 103 may raise a corresponding one of the soldering pads 102 to facilitate subsequently wiring, and may also protect the corresponding one of the soldering pads 102 and conduct heat. As illustrated in FIG. 24, the first plastic encapsulation layer 132 may be formed on a surface of the wafer 100 (on the functional surfaces of the semiconductor chips 101) to cover the metal bumps 130. The first plastic encapsulation layer 132 may be formed by an injection molding process or a transfer molding process, and may be made of a material including a resin. The resin may include epoxy resin, polyimide resin, benzocyclobutene resin, polybenzoxazole resin, or a combination thereof. As illustrated in FIG. 25, the wafer 100 may be cut along the cutting path to form the discrete semiconductor chips 101.

In the present embodiment, before cutting the wafer 100, the first plastic encapsulation layer 132 may be formed. When performing the injection molding process or transfer molding process, the wafer may not move in a mold of an injection molding device or a transfer molding device, and the formed first plastic encapsulation layer 132 may have a flat surface, therefore. After cutting the wafer 100, the first plastic encapsulation layer 132 on the semiconductor chips 101 may be adhered to the carrier plate. Since the formed first plastic encapsulation layer 132 may have a flat surface, each of the semiconductor chips 101 and the carrier plate may have a high adhesion. Without forming the first plastic encapsulation layer, some of the semiconductor chips formed by cutting the wafer may have uneven surfaces and height of the metal bumps at different positions may be different. By forming the first plastic encapsulation layer, when forming a second plastic encapsulation layer covering the semiconductor chips 101 on the carrier plate subsequently, insufficient adhesion between some of the semiconductor chips 101 and the carrier plate, and displacement of some of the semiconductor chips under impact of pressure in the injection or transfer molding processes may be prevented. Therefore, when forming a rewiring layer subsequently, connecting positions between the rewiring layer and the corresponding soldering pads may be prevented from shifting and influence on the connecting performance between the rewiring layer and the corresponding soldering pads may be avoided. Correspondingly, stability and reliability of the packaging structure may be improved.

In one embodiment, the wafer 100 may be made of a material including single-crystalline silicon, single-crystalline germanium, GeSi, SiC, silicon on an insulator (SOI), germanium on an insulator (GOI), or other materials including III-V compounds such as GaAs.

In one embodiment, integrated circuits in the semiconductor chips 101 may include semiconductor devices (such as transistors, memories, or diodes) and/or interconnection structures connecting the semiconductor devices (such as metal wires or metal plugs).

In one embodiment, the semiconductor chips may be semiconductor chips requiring electromagnetic shielding.

Figure 26:
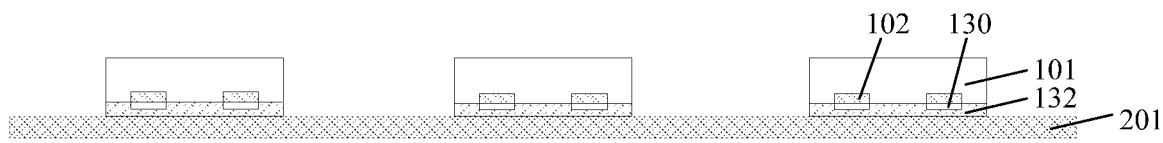

As illustrated in FIG. 26, a carrier plate 201 may be provided and the first plastic encapsulation layer 132 on the functional surfaces of the semiconductor chips 101 may be adhered to the carrier plate 210.

The carrier plate 201 may provide a support platform for subsequent processes. In one embodiment, the carrier plate 210 may be a glass carrier plate, a silicon carrier plate, or a metal carrier plate. In some other embodiments, the carrier plate 210 may be a carrier plate made of other suitable materials.

The first plastic encapsulation layer 132 on the functional surfaces of the semiconductor chips 101 may be adhered to the carrier plate 210 through an adhesive layer, and the functional surfaces of the semiconductor chips 101 (or the soldering pads 102) may face an adhesive surface of the carrier plate 201.

The adhesive layer may be made of any suitable material. In one embodiment, the adhesive layer may be made of UV glue. The UV glue may be an adhesive material that can react to ultraviolet light with a special wavelength. The UV glue may include two types according to change in its viscosity after ultraviolet light irradiation. One type of the UV glue may be a UV curing glue. A photoinitiator or photosensitizer of a material of the UV curing glue may absorb the ultraviolet light under ultraviolet radiation to generate active radicals or cations. Correspondingly, monomer polymerization, cross-linking, or grafting chemical reactions may be initiated to make the UV curing glue change from liquid to solid in a few seconds, thereby bonding the UV curving glue with a surface of an object in contact with the UV curing glue. Another type of the UV glue may have a high viscosity when not exposed to the ultraviolet irradiation. After the ultraviolet irradiation, cross-linking chemical bonds in a material of the UV glue may be broken, resulting in a significant decrease or disappearance of the viscosity. In one embodiment, the UV glue in the adhesive layer may be the latter, and may be formed by a film sticking process, a glue printing process, or a rolling glue process.

In some other embodiments, the adhesive layer may be made of a material including epoxy glue, polyimide glue, polyethylene glue, benzocyclobutene glue, or polybenzoxazole glue.

The semiconductor chips 201 may be adhered to the carrier plate 201 evenly in rows and columns.

Figure 27:
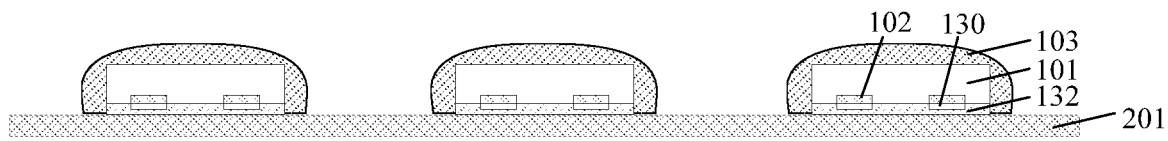

As illustrated in FIG. 27, a first shielding layer 103 may be formed to cover the non-functional surfaces and the sidewalls of each semiconductor chip 101, and a surface of the first shielding layer 103 may be ellipsoid.

In some embodiments, the first shielding layer 103 may be formed by a dispensing process or a mesh printing process on the non-functional surface and the sidewalls of each semiconductor chip 101, and the sidewalls of the first plastic encapsulation layer 132. The first shielding layer may be not formed on surfaces of a portion of the carrier plate 201 at sides of each semiconductor chip 101. The first shielding layer 103 may evenly cover the non-functional surface and the sidewalls of each semiconductor chip 101. The first shielding layer 103 may be made of solder or conductive silver paste, and may be formed by the dispensing process for dispensing the solder or conductive silver paste on the non-functional surface and the sidewalls of each semiconductor chip 101 to form the first shielding layer 103 with the ellipsoid surface. In another embodiment, a solder layer may be formed on the non-functional surface and the sidewalls of each semiconductor chip 101 by the mesh printing process, and then the first shielding layer 103 with the ellipsoid surface may be formed by a re-flowing process. The solder may be a metal including tin, tin-silver, tin-lead, tin-silver copper, tin silver-zinc, tin zinc, tin bismuth indium, tin indium, tin gold, tin copper, tin zinc indium, tin-silver antimony, or a combination thereof.

The surface of the first shielding layer 103 may be ellipsoidal may means that the surface of the first shielding layer 103 may have no sharp corners. The surface of the first shielding layer 103 may be arc-shaped. Correspondingly, the first shielding layer 103 with the ellipsoidal surface may evenly and completely cover the non-functional surfaces and the sidewalls of the semiconductor chips 101. Further, when forming a second shielding layer on the ellipsoidal surface of the first shielding layer 103, a problem that the second shielding layer has uneven thickness and poor edge coverage may be avoided. An overall shielding layer formed by the first shielding layer and the second shielding layer may be complete, and the shielding performance may be improved.

In some embodiments, an intermediate material layer (not shown in the figures) may be formed on the non-functional surfaces and the sidewalls of the semiconductor chips 101. The intermediate material layer may have an ellipsoidal surface. The first shielding layer 103 may be formed on the intermediate material layer subsequently and the surface of the first shielding layer 103 may be ellipsoidal. By forming the intermediate material layer, the first shielding layer with different materials may be formed on the intermediate material layer by different processes, and the surface of the first shielding layer 103 may be ellipsoidal. Further, when forming the first shielding layer on the ellipsoidal surface of the intermediate material layer, the first shielding layer may not be affected by the sharp corners or steep sidewalls. Correspondingly, a problem that the second shielding layer has uneven thickness and poor edge coverage in the first shielding layer may be avoided. The integrity of the shielding layer may be improved.

In some embodiments, the intermediate material layer may be made of a material including non-conductive glue, conductive silver paste, fluid resin, or solder. The intermediate material layer may be formed by a dispensing process or a mesh printing process. The first shielding layer with the ellipsoidal surface may be formed by a sputtering process, a selective plating process, a dispensing process, or a mesh printing process. The first shielding layer may be made of a material including copper, tungsten, aluminum, solder, or conductive silver paste. The first shielding layer may also be made of a material of the magnetic field shielding layer and electric field shielding layer.

In one embodiment, a thickness of the first shielding layer 103 may equal to a thickness of the first plastic encapsulation layer on top surfaces of the metal bumps 130. Subsequently, a portion of the first plastic encapsulation layer may be removed by polishing to expose the metal bumps, and a portion of the first shielding layer between the semiconductor chips may be removed simultaneously. Correspondingly, the top surfaces of the metal bumps may be flush with a surface of the second encapsulation layer, the surface of the remaining first encapsulation layer, a bottom surface of the first shielding layer, and a bottom surface of a second shielding layer. In other embodiments, the thickness of the first shielding layer 103 may be any other suitable value.

In one embodiment, the formed first shielding layer 103 may be a shielding layer for electric field and magnetic field, and may be used for shielding the electric field and the magnetic field. The second shielding layer formed subsequently may also be a shielding layer for the electric field and the magnetic field, and may be used for shielding the electric field and the magnetic field.

A shielding layer may be needed to shielding the electric field and the magnetic field. An existing single-layer shielding layer with a specific material or an existing shielding layer including multilayer same or similar materials may only have a good shielding effect for the electric field, and have a weak shielding effect for the magnetic field. The shielding performance may be poor. In some other embodiments, the first shielding layer 103 may be a shielding layer for the magnetic field, and may be used for shielding the magnetic field. The second shielding layer formed subsequently may be a shielding layer for the electric field, and may be used for shielding the electric field. In some other embodiments, the first shielding layer 103 may be a shielding layer for the electric field, and may be used for shielding the electric field. The second shielding layer formed subsequently may be a shielding layer for the magnetic field, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the first shielding layer 103 is the electric field shielding layer, the first shield layer 103 (the electric field shielding layer) may be made of a material including copper, tungsten, or aluminum. When the first shielding layer 103 is a magnetic field shielding layer, the first shield layer 103 (the magnetic field shielding layer) may be made of a material including CoFeB alloy, CoFeTa, NiFe, Co, CoFe, CoPt, or Ni—Co—Fe alloy. The first shielding layer 103 may be formed by a sputtering process, a physical vapor deposition process, an atomic layer deposition process, a chemical vapor deposition process, or any other suitable processes.

Figure 28:
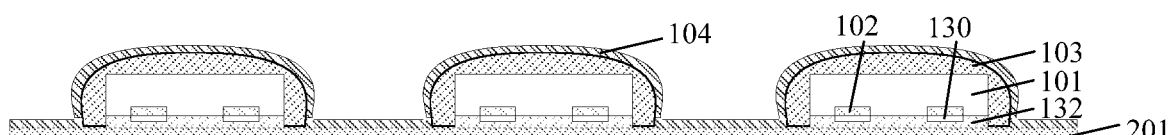

As illustrated in FIG. 28, a second shielding layer 104 may be formed on the first shielding layer 103.

By forming the second shielding layer 104 on the first shielding layer 103, the second shielding layer 104 may cover a portion of the first shielding layer 103 with the uneven thickness and poor edge coverage. Correspondingly, the overall shielding layer constituted by the first shielding layer 103 and the second shielding layer 104 may be complete, improving the shielding performance.

In one embodiment, the second shielding layer 104 may be formed by a sputtering process, and may be made of a metal including copper, tungsten, or aluminum. The second shielding layer 104 may cover the first shielding layer 103 on the non-functional surfaces and the sidewalls of the semiconductor chips 101, and also may be located on a surface of a portion of the carrier plate 201 at sides of the semiconductor chips 101.

In some other embodiments, the second shielding layer 104 may cover the first shielding layer 103 on the non-functional surfaces and the sidewalls of the semiconductor chips 101. The second shielding layer 104 may have an ellipsoidal surface. The second shielding layer 104 may be formed by a selective plating process, a dispensing process or a mesh printing process, so that the formed second shielding layer 104 can better cover the first shielding layer and prevent the second shielding layer 104 from forming areas with poor coverage. Correspondingly, the integrity of the overall shield layer formed by both the first shield layer 103 and the second shield layer 104 may be further ensured, and the subsequent removal of the semiconductor chips may not need additional masking and etching processes.

In some embodiments, the second shielding layer 104 may be made of a material including copper, solder, or conductive silver paste. In one embodiment, the second shielding layer 104 may be made of copper, and may be formed by: forming a mask layer (not shown in the figures) on the carrier plate 201 where the mask layer includes openings exposing the portion of the first shielding layer 103 on the non-functional surfaces and the sidewalls of the semiconductor chips 101; forming the second shielding layer 104 in the openings by using the first shielding layer as a conductive layer in the plating process to electroplate; and removing the mask layer.

In another embodiment, the second shielding layer 104 may be made of solder or conductive silver paste, and may be formed by the dispensing process or the mesh printing process correspondingly. When performing the dispensing process, the solder or the conductive silver paste may be applied on a surface of the portion of the first shielding layer 103 on the non-functional surfaces and the sidewalls of the semiconductor chips 101. When performing the mesh printing process, a portion of the first shielding layer 103 on a portion of the carrier plate 201 around the semiconductor chips 101, and correspondingly a remaining portion of the first shielding layer 103 may cover the non-functional surfaces and the sidewalls of the semiconductor chips 101, and side surfaces of a underfill layer. The remaining portion of the first shielding layer 103 may further extend to partially cover the surface of the portion of the carrier plate 201 around the semiconductor chips 101. Then a mesh plate with meshes may be placed on the carrier plate 201 and each of the semiconductor chips may be placed in a correspondingly mesh in the mesh plate. Subsequently, the solder may be brushed into the meshes and the solder may cover the surface of the portion of the first shielding layer 103 on the non-functional surfaces and the sidewalls of the semiconductor chips 101. Then the mesh plate may be removed and the solder may be reflowed to form the second shielding layer 104.

In one embodiment, the solder may be a metal including tin, tin-silver, tin-lead, tin-silver copper, tin silver-zinc, tin zinc, tin bismuth indium, tin indium, tin gold, tin copper, tin zinc indium, tin-silver antimony, or a combination thereof.

In some other embodiments, the first shielding layer 103 may be a shielding layer for the magnetic field, and the second shielding layer 104 may be a shielding layer for the electric field. In some other embodiments, the first shielding layer 103 may be a shielding layer for the electric field, and may be used for shielding the electric field. The second shielding layer 104 may be a shielding layer for the magnetic field, and may be used for shielding the magnetic field. By forming the first shielding layer and the second shielding layer with the above structure, the first shielding layer and the second shielding layer may shield the electric field and the magnetic field respectively, and the shielding performance of the shielding layer may be improved. When the second shielding layer 104 is the electric field shielding layer, the second shielding layer 104 (the electric field shielding layer) may be made of a material including copper, tungsten, or aluminum. When the second shielding layer 104 is a magnetic field shielding layer, the second shielding layer 104 (the magnetic field shielding layer) may be made of a material including CoFeB alloy, CoFeTa, NiFe, Co, CoFe, CoPt, or Ni—Co—Fe alloy. The second shielding layer 104 may be formed by a sputtering process, a physical vapor deposition process, an atomic layer deposition process, a chemical vapor deposition process, or any other suitable processes.

Figure 29:
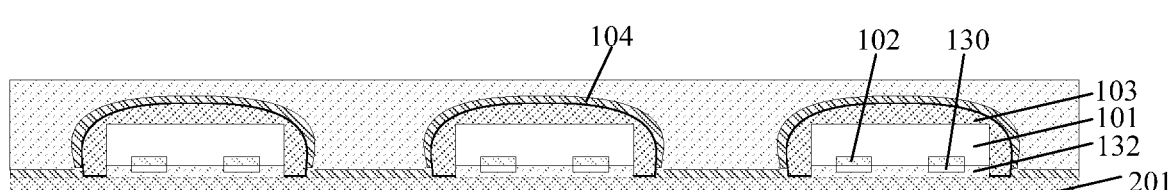

As illustrated in FIG. 29, a second plastic encapsulation layer 105 may be formed on the second shielding layer 104 and on the portion of the carrier plate 201 between the semiconductor chips 101.

The second plastic encapsulation layer 105 may encapsulate and fix the semiconductor chips 101, for forming a pre-packaging plate subsequently.

The second plastic encapsulation layer 105 may be made of a material including epoxy resin, polyimide resin, benzocyclobutene resin, polybenzoxazole resin, polybutylene terephthalate, polycarbonate, polyethylene terephthalate, polyethylene, Polypropylene, polyolefin, polyurethane, polyolefin, polyethersulfone, polyamide, polyurethane, ethylene-vinyl acetate copolymer, polyvinyl alcohol, or a combination thereof.

The second plastic encapsulation layer 105 may be formed by an injection molding process, a transfer molding process, or any other suitable processes.

Figure 30:
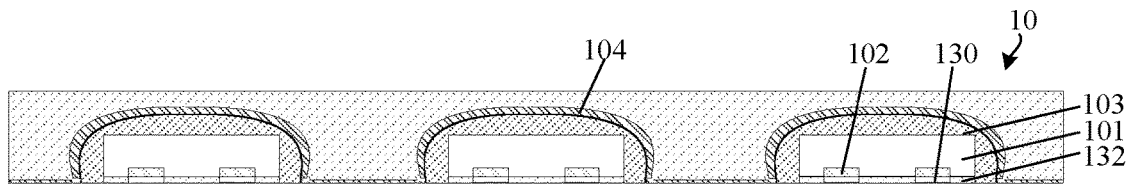

As illustrated in FIG. 30, the carrier plate 201 may be peeled off to form the pre-packaging plate 10, and a portion of the first plastic encapsulation layer 132 may be removed to expose the metal bumps 130.

The adhesive layer may be removed by a process including chemical etching, mechanical peeling, CMP, mechanical grinding, or hot baking, to peel off the carrier plate 201.

A portion of the first plastic encapsulation layer 132 may be removed by a polishing process, to expose the metal bumps 130. The polishing process may include a chemical mechanical polishing process.

In one embodiment, when removing the portion of the first plastic encapsulation layer 132 by the polishing process to expose the metal bumps 130, the portion of the first shielding layer 103 between the semiconductor chips 101 may be removed simultaneously, to make the top surfaces of the metal bumps flush with the surface of the second encapsulation layer 105, the surface of the remaining first encapsulation layer 132, a bottom surface of the first shielding layer 103, and a bottom surface of a second shielding layer 104.

Figure 31:
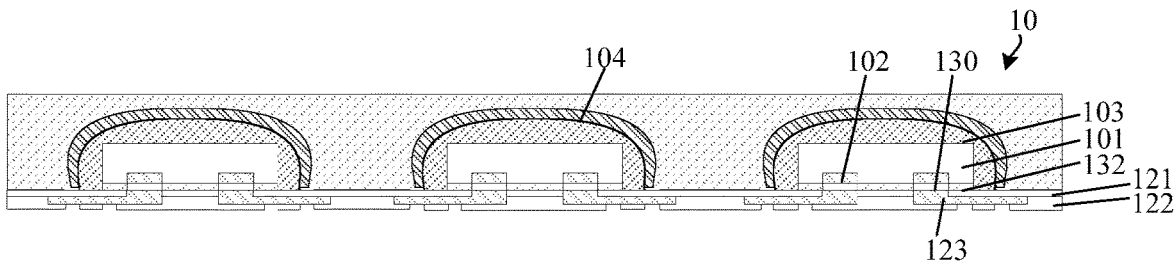
Figure 32:
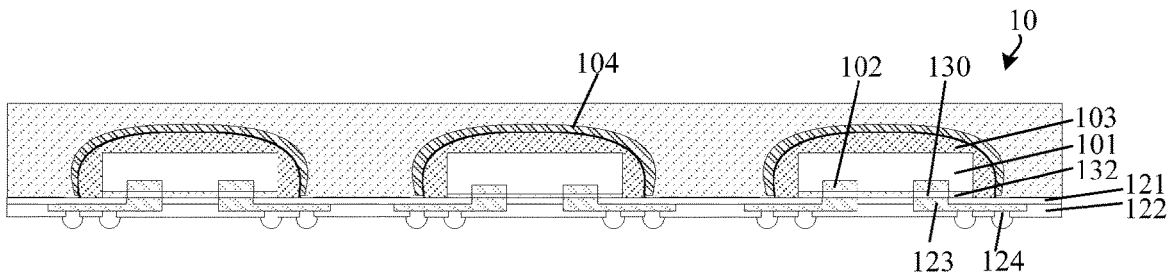

As illustrated in FIGS. 31-32, for each metal bump 130, an external contact structure connected to the metal bump 130 may be formed on the first plastic encapsulation layer 132.

In one embodiment, each external contact structure may include a rewiring layer 123 connected to a corresponding metal bump 130 and external contact parts 124 on and connected to the rewiring layer 123. Each metal bump 130 on each of the semiconductor chips 101 may be connected to corresponding external contact parts 124.

In one embodiment, rewiring layers 123 and external contact parts 124 in external contact structures of the semiconductor chips 101 may be formed by: forming an insulating layer (a first insulating layer) 121 on a backside of the pre-packaging plate 10 where the insulating layer (the first insulating layer) 121 includes openings exposing the metal bumps 130; forming a rewiring layer 123 in each opening and on a surface of a portion of the insulating layer (the first insulating layer) 121; and forming the external contact parts 124 on a portion of each rewiring layer 123 outside a corresponding opening. The insulating layer (the first insulating layer) 121 may be made of a material including SiN, silicon-boron glass, silicon-phosphor glass, silicon-boron-phosphor glass, or a combination thereof. In one embodiment, each external contact part 123 may be a soldering ball or include a metal post and a soldering ball on the soldering post. The external contact parts 123 may be formed by: forming a second insulating layer 122 on the first insulating layer 121 and on the rewiring layers 123, where the second insulating layer 122 may include second openings exposing a portion of a surface of each rewiring layer 123 on the surface of the first insulating layer 121; and forming the external contact parts 124 in the second openings.

In one embodiment, the conductive contact structures may be further formed on the first insulating layer 121 to electrically connect the first shielding layer 103 to a portion of the rewiring layers 123. Correspondingly, the shielding layer may discharge through the portion of the rewiring layers 123 or block external static electrical interference.

Figure 33:
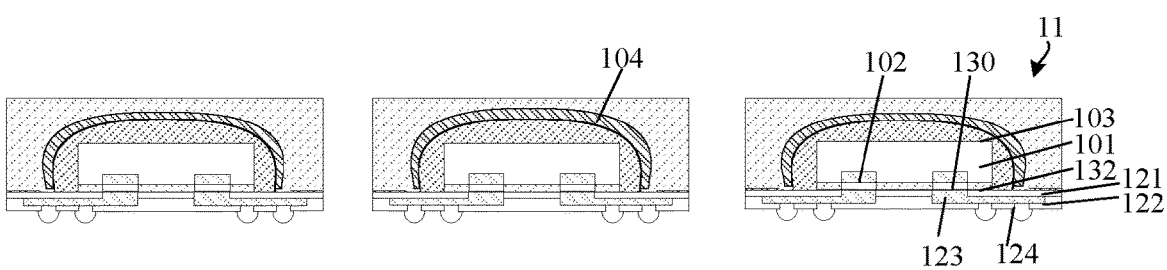

As illustrated in FIGS. 32-33, after forming the external contact structures, the pre-packaging plate may be cut to form discrete packaging structures 11.

As illustrated in FIG. 33, each packaging structure of the discrete packaging structures 11 may include the second plastic encapsulation layer 105, and a semiconductor chip 101 of the semiconductor chips 101 embedded in the second plastic encapsulation layer 105. The semiconductor chip 101 may include a functional surface and a non-functional surface opposite to the functional surface. A soldering pads 102 may be disposed on the functional surface and a metal bump 103 may be formed on each of the soldering pads 102. The second plastic encapsulation layer 105 may expose metal bumps on the soldering pads 102. The packaging structure 11 may further include a first plastic encapsulation layer 132 on the functional surface to cover sidewalls of the metal bumps 130 and expose the top surfaces of the metal bumps 130. A bottom surface of the first plastic encapsulation layer 132 may be flush with a bottom surface of the second plastic encapsulation layer 105. The packaging structure 11 may further include the first shielding layer 103 and the second shielding layer 104 between the semiconductor chip 101 and the second plastic encapsulation layer 105, and between the first plastic encapsulation layer 132 and the second plastic encapsulation layer 105. The first shielding layer 132 may cover the non-functional surface and the sidewalls of the semiconductor chip 101, and the sidewalls of the first plastic encapsulation layer 132. The second shielding layer 104 may be disposed between the first shielding layer 103 and the second plastic encapsulation layer 105, and may completely cover a surface of a portion of the first shielding layer 103 on the non-functional surface and the sidewalls of the semiconductor chip 101, and on the sides of the first plastic encapsulation layer 132.

The packaging structure 11 may further include external contact structures connected to the soldering pads 101 on the first plastic encapsulation layer 132.

Each external contact structure may include a rewiring layer 123 on the backside of the pre-packaging plate 10 and electrically connected to a corresponding metal bump 130, and external contact parts 124 on the rewiring layer and electrically connected to the rewiring layer 123.

In the present disclosure, massive production of the packaging structure 11 with the first shielding layer 103 and the second shielding layer 104 may be achieved by the above semiconductor integration fabrication process. Producing efficiency may be improved.

The present disclosure also provides another fabrication method for forming a packaging structure. FIGS. 34-40 illustrate semiconductor structures corresponding to different stages in the fabrication method for forming a packaging structure. In comparison to the previous fabrication method, in the present method, a bottom shielding layer may be formed on the functional surfaces of the semiconductor chips. The bottom shielding layer may completely cover the functional surfaces of the semiconductor chips, and have surrounding edges flush with surrounding sidewalls of the semiconductor chips. The soldering pads may penetrate through the bottom shielding layer, and may be separated from the bottom shielding layer through isolation layers. When forming the first shielding layer, the first shielding layer may be connected to the surrounding edges of the bottom shielding layer. In the present method, the second shielding layer may be formed on the first shielding layer after forming the first shielding layer. By forming the second shielding layer on the first shielding layer, the second shielding layer may cover areas of the first shielding layer with an uneven thickness and poor edge coverage, thereby making an overall shield layer formed by the first shielding layer and the second shielding layer complete, to improve shielding performance. Further, the bottom shielding layer may be formed on the functional surfaces of the semiconductor chips, and when forming the first shielding layer, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

Figure 34:
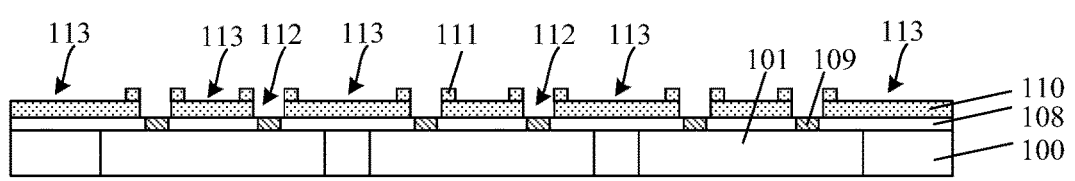
FIGS. 34-40 illustrate structures corresponding to certain stages in another exemplary fabrication method for forming a packaging structure according to various disclosed embodiments of the present disclosure.

The semiconductor chips with the bottom shielding layer may be formed by the following processes. As illustrated in FIG. 34, a wafer 100 and semiconductor chips 101 on the wafer 100 may be provided. Each semiconductor chip 101 of the semiconductor chips 101 may include a top dielectric layer 108 and a top interconnection structure 109 in the top dielectric layer 108. The semiconductor chip 101 may further include semiconductor devices (such as transistors) formed on a surface of the wafer 100 (or on a semiconductor substrate), interlayer dielectric layers between the top dielectric layer 108 and the surface of the wafer 100. Each of the interlayer dielectric layers may include a corresponding interconnection structure. Interconnection structures in the interlayer dielectric layers may connect upper or lower layers, or electrically connected to the semiconductor devices. The top interconnection structure 109 in the top dielectric layer 108 may be electrically connected to an interconnection structure in an adjacent interlayer dielectric layer of the interlayer dielectric layers.

Subsequently, an isolation layer may be formed on each top dielectric layer 108.

In one embodiment, each isolation layer may have a multilayer structure, and may include a first isolation layer 110 and a second isolation layer 111 on the first isolation layer 110. The first isolation 110 and the second isolation layer 111 may be made of different materials. The first isolation 110 and the second isolation layer 111 may be made of one of SiO2, SiN, or SiNO respectively, to achieve precise control of depth of second openings formed subsequently. Correspondingly, when forming the second openings, an excessive etching of the isolation layer which may induce exposing of a portion of a surface of the top interconnection structure 109 on the top dielectric layer 108 by the second openings and short circuits between top interconnection structures 109 when forming the bottom shielding layer in the second openings, may be prevented.

In some other embodiments, each isolation layer may have a single-layer structure.

Figure 35:
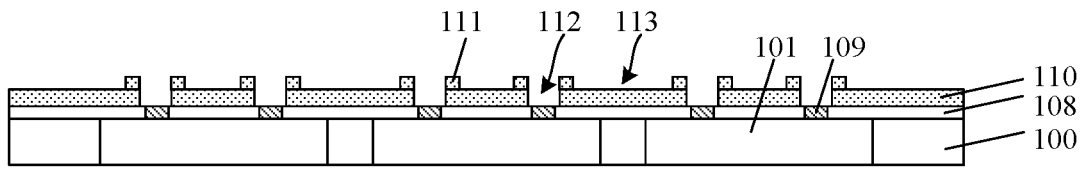

As illustrated in FIG. 35, the isolation layers may be etched to form first openings 112 and second openings 113 surrounding the first openings 112. A remaining portion of the isolation layers may be only located between the first openings 112 and the second openings 113, to separate the first openings 112 from the second openings 113.

The first openings 112 may be discrete and penetrate through the isolation layers 111. Each first opening 112 may expose a portion of a surface of a corresponding interconnection structure 109. The first openings 112 may be filled with metal to form the soldering pads.

Each second opening 113 may surround a corresponding first opening 112, and may be separated from the corresponding first opening 112 through the isolation layers 111. Each second opening 113 may have a depth smaller than a thickness of the isolation layer. All areas outside the first openings 112 and outside the isolation layer 111 surrounding the first openings 112 may correspond to areas of the second openings 113. The second openings 113 may be connected. When forming the bottom shielding layer in the second openings 113, the bottom shielding layer may cover all areas of the functional surfaces of the semiconductor chips 101 except for the soldering pads (formed in the first openings 112) and the isolation layer surrounding the soldering pads. When forming the first shielding layer on the non-functional surfaces and the sidewalls of the semiconductor chips 101, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

In one embodiment, the second isolation layers 111 may be etched using a first etch process with the first isolation layers 110 as a stop layer, to form the second openings in the second isolation layers 111. Subsequently, the second isolation layers 111 and the first isolation layers 110 may be etched using a second etch process, to form the first openings in the second isolation layers 111 and the first isolation layers 110. Before the first and the second etch processes, a corresponding mask layer may be formed on the second isolation layers. In some other embodiment, the second etch process may be performed before the first etch process.

In some other embodiments, each isolation layer may have a single-layer structure, and the first openings and the second openings may be formed by two etch processes respectively. Depth of the second openings may be controlled by controlling the etch time of the etch process (the depth of the second openings may be smaller than the thickness of the isolation layers).

Figure 36:
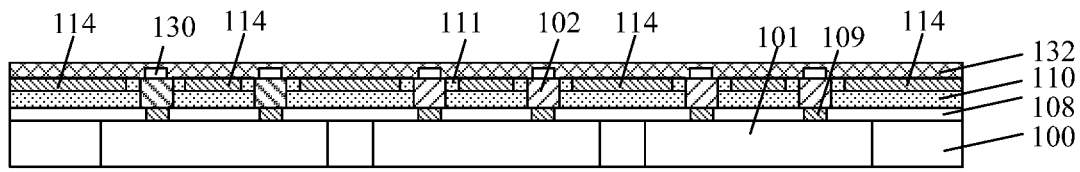
Figure 37:
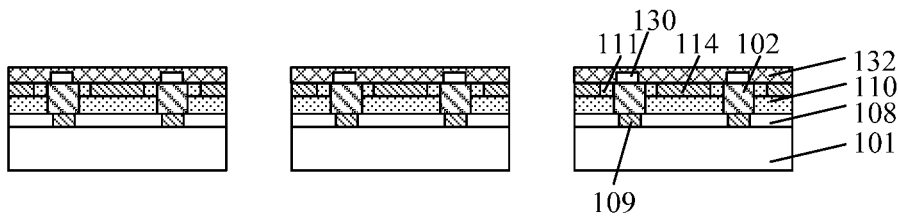

As illustrated in FIG. 36, a soldering pad 102 may be formed in each first opening by filling the first opening with metal, and the bottom shielding layer 114 may be formed in the second openings by filling the second openings with metal. A metal bump 130 may be formed on each soldering pad 102. A first encapsulation layer 132 may be formed covering metal bumps 130 and the bottom shielding layer 114. As illustrated in FIG. 37, after forming the first encapsulation layer 132, the wafer 100 may be cut to form the discrete semiconductor chips 101 with the bottom shielding layer 114.

In some embodiments, soldering pads 102 on the semiconductor chips 101 and the bottom shielding layer 114 may be formed by a same process including: forming a metal material layer in the first openings, in the second openings, and on the isolation layers by a physical vapor deposition process, a sputtering process, or a plating process; planarizing the metal material layer to remove a portion of the metal material layer higher than the surfaces of the isolation layers and form a soldering pad in each first opening and the bottom shielding layer 114 in the second openings. The metal material layer may be made of a material including aluminum, nickel, tin, tungsten, platinum, copper, titanium, chromium, tantalum, gold, silver, or a combination thereof.

Figure 38:
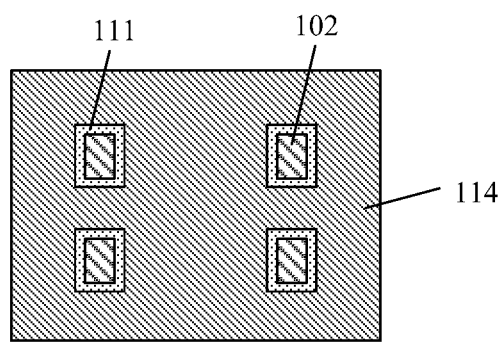

As illustrated in FIG. 38 which is a top view of the soldering pads 102 and the bottom shielding layer 104 in FIG. 37, each semiconductor chip 101 of the discrete semiconductor chip 101 may include the bottom shielding layer 114 on the functional surface, and the bottom shielding layer 114 may cover the whole functional surface of the semiconductor chip 101. The surrounding edges of the bottom shielding layer 114 may be flush with the surrounding sidewalls of the semiconductor chip 101. The soldering pads 102 may penetrate through the bottom shielding layer and may be isolated from the bottom shielding layer 114 by the isolation layers 111.

In the present embodiment, the process for forming the bottom shielding layer 114 may be integrated in the existing fabrication processes of the semiconductor chips, and may be performed synchronically with the process for forming the soldering pads 102. The fabrication process may be simplified and the process difficulty may be reduced, to improve the efficiency.

Figure 39:
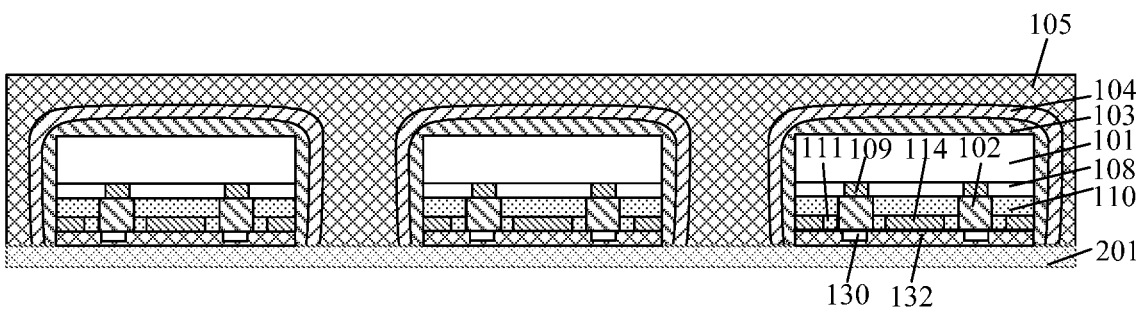

As illustrated in FIG. 39, the semiconductor chips 101 with the first plastic encapsulation layer 132 may be adhered to the carrier plate 201, and the first plastic encapsulation layer 132 may be in contact with the carrier plate 201. The first shielding layer 103 with an ellipsoidal surface may be formed to cover the non-functional surfaces and the sidewalls of the semiconductor chips 101, and the second shielding layer 104 may be formed on the first shielding layer 103. The second plastic encapsulation layer 105 may be formed on the second shielding layer 104 and on a portion of the carrier plate 201 between the semiconductor chips 101.

Figure 40:
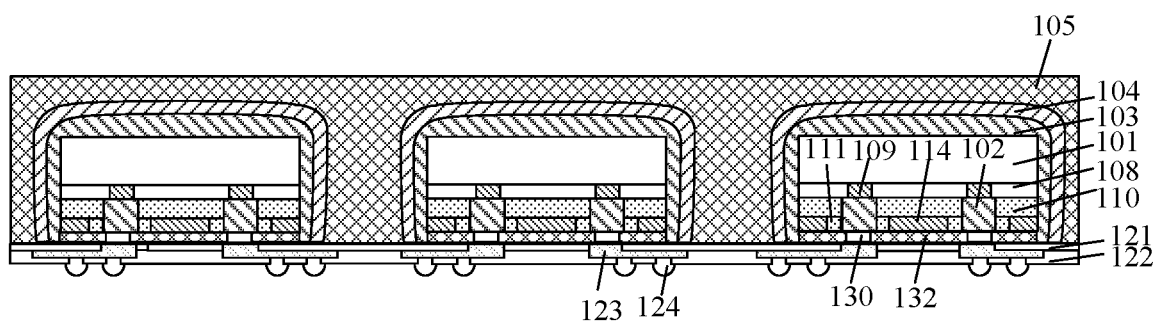

As illustrated in FIG. 40, the carrier plate 201 may be peeled off to form the pre-packaging plate 10 exposing the first encapsulation layer, and a portion of the first plastic encapsulation layer 132 may be removed to expose the metal bumps 130. For each metal bump 130, an external contact structure connected to the metal bump 130 may be formed on the first plastic encapsulation layer 132. Each external contact structure may include a rewiring layer 123 connected to a corresponding metal bump 130 and external contact parts 124 on and connected to the rewiring layer 123.

It should be noted that other definitions or descriptions of the same or similar structures in the present embodiment as in the previous embodiments will not be repeated. For details, please refer to the definitions or descriptions of the corresponding parts in the previous embodiments.

The present disclosure also provides a packaging structure. As illustrated in FIG. 31 and FIG. 40, the packaging structure may include:

a pre-packaging plate 10, a second plastic encapsulation layer 105 in the pre-packaging structure 10, semiconductor chips 101 surrounded by the second plastic encapsulation layer 105 where each semiconductor chip 101 may include a functional surface and a non-functional surface opposite to the functional surface, soldering pads 102 on the functional surfaces of the semiconductor chips 101 where the second plastic encapsulation layer 105 may expose the soldering pads 102, metal bumps 130 on the soldering pads 102, a first plastic encapsulation layer 132 on the functional surfaces covering sidewalls of the metal bumps 132 and exposing top surfaces of the metal bumps, a first shielding layer 103 and a second shielding layer 104 between the semiconductor chips 101 and the first plastic encapsulation layer 132 and between the first plastic encapsulation layer 132 and the second plastic encapsulation layer 105, and external contact structures on the first plastic encapsulation layer 132 and connected to the metal bumps 130.

A bottom surface of the first plastic encapsulation layer 132 may be flush with a bottom surface of the second plastic encapsulation layer 105. The first shielding layer 103 may surround non-functional surfaces and sidewalls of the semiconductor chips 101, and sidewalls of the first plastic encapsulation layer 132. The first shielding layer 103 may have an ellipsoidal surface. The second shielding layer 104 may be disposed between the first shielding layer 103 and the second plastic encapsulation layer 105, and may completely cover a surface of the first shielding layer 103 on the non-functional surfaces and sidewalls of the semiconductor chips 101, and on the sidewalls of the first plastic encapsulation layer 132.

In one embodiment, the first shielding layer 103 may be formed directly on the non-functional surfaces and the sidewalls of the semiconductor chips 101 by a dispersing process or a mesh printing process, and the second shielding layer 104 may be formed by a sputtering process, a selective plating process, a dispensing process or a mesh printing process. The second shielding layer 104 may be made of a material including copper, tungsten, aluminum, or a combination thereof. The first shielding layer 103 may be made of a material including copper, solder, or conductive silver paste.

In some other embodiments, the packaging structure may further include an intermediate material layer on the non-functional surfaces and the sidewalls of the semiconductor chips 101 and the intermediate material layer may have an ellipsoidal surface. The first shielding layer may be formed on the intermediate material layer and may have an ellipsoidal surface.

In some embodiments, the first shielding layer 103 may be a shielding layer for the magnetic field, and the second shielding layer 104 may be a shielding layer for the electric field. In some other embodiments, the first shielding layer 103 may be a shielding layer for the electric field, and may be used for shielding the electric field. The second shielding layer 104 may be a shielding layer for the magnetic field, and may be used for shielding the magnetic field. The electric field shielding layer may be made of a material including copper, tungsten, or aluminum. The magnetic field shielding layer may be made of a material including CoFeB alloy, CoFeTa, NiFe, Co, CoFe, CoPt, or Ni—Co—Fe alloy.

In some embodiments, as illustrated in FIG. 40, the packaging structure may further include a bottom shielding layer 114 on the functional surfaces of the semiconductor chips 101. The bottom shielding layer 114 may cover the whole functional surfaces of the semiconductor chips 101, and may have surrounding edges flush with the sidewalls of the semiconductor chips 101. The soldering pads 102 may penetrate through the bottom shielding layer 114, and may be isolated from the bottom shielding layer 114 through isolation layers 111. The first plastic encapsulation layer 132 may cover the bottom shielding layer 114. The first shielding layer 103 may be connected to surrounding edges of the bottom shielding layer 114.

In one embodiment, each external contact structure may include a rewiring layer 123 on a backside of the pre-packaging plate and connected to a corresponding soldering pad 102, and an external contact part 124 on and connected to the rewiring layer 123.

The pre-packaging plate may include a first insulating layer 121 on the backside of the pre-packaging plate. The first insulating layer 121 may include openings exposing surfaces of the soldering pads 102. Each rewiring layer 123 may be located in a corresponding opening and on a portion of the first insulating layer 121, and each external contact part 124 may be located on a surface of a corresponding rewiring layer 123 outside a corresponding opening.

The packaging structure may further include a second insulating layer 122 covering the first insulating layer 121. A portion of each external contact part 124 may be located in the second insulating layer 122.

In some embodiments, the packaging structure may further include a conductive contact structure (not shown in the figures) in the first insulating layer 121 and electrically connected the first shielding layer 103 to a portion of a corresponding rewiring layer 123.

In the present disclosure, after adhering the first plastic encapsulation layer on the functional surfaces of the semiconductor chips to the carrier plate, the first shielding layer may be formed to cover the non-functional surfaces and the sidewalls of the semiconductor chips, and the sidewalls of the first plastic encapsulation layer. The second shielding layer may be formed on the first shielding layer and the second plastic encapsulation layer may be formed on the second shielding layer and on the carrier plate between the semiconductor chips. Then the carrier plate may be peeled off to form the pre-packaging plate. The backside of the pre-packaging plate may expose the first plastic encapsulation layer. A portion of the first plastic encapsulation layer may be removed to expose the metal bumps. Then the external contact structures connected to the metal bumps may be formed on the backside of the pre-packaging plate. By forming the second shielding layer on the first shielding layer, the second shielding layer may completely cover a surface of a portion of the first shielding layer on the non-functional surfaces and the sidewalls of the semiconductor chips, and on the side surfaces of the first plastic encapsulation layer. The second shielding layer may cover a portion of the first shielding layer with uneven thickness and poor edge coverage. The overall shielding layer formed by the first shielding layer and the second shielding layer may be complete. The shielding performance may be improved.

The first plastic encapsulation layer 132 may have a flat surface, each of the semiconductor chips 101 and the carrier plate may have a high adhesion. Without forming the first plastic encapsulation layer, some of the semiconductor chips formed by cutting the wafer may have uneven surfaces and height of the metal bumps at different positions may be different. By forming the first plastic encapsulation layer, when forming a second plastic encapsulation layer covering the semiconductor chips 101 on the carrier plate subsequently, insufficient adhesion between some of the semiconductor chips 101 and the carrier plate, and displacement of some of the semiconductor chips under impact of pressure in the injection or transfer molding processes may be prevented. Therefore, when forming a rewiring layer subsequently, connecting positions between the rewiring layer and the corresponding soldering pads may be prevented from shifting and influence on the connecting performance between the rewiring layer and the corresponding soldering pads may be avoided. Correspondingly, stability and reliability of the packaging structure may be improved.

The second shielding layer may be only located on a portion of the first shielding layer on the non-functional surfaces and the sidewalls of the semiconductor chips, and may have an ellipsoidal surface. The second shielding layer may be formed by a selective plating process, a dispersing process, or a mesh printing process. The second shielding layer may cover the first shielding layer to prevent forming of an area with poor coverage in the second shielding layer, further improve the integrity of the overall shielding layer formed by the first shielding layer and the second shielding layer. Subsequently, no extra mask or etching process may be necessary for removing the semiconductor chips.

The intermediate material layer may be formed on the non-functionals surfaces and the sidewalls of the semiconductor chips, and may have an ellipsoidal surface. The first shielding layer may be formed on the intermediate material layer, and may also have an ellipsoidal surface. By forming the intermediate material layer, the first shielding layer with different materials may be formed on the intermediate material layer by different processes, and the surface of the first shielding layer 103 may be ellipsoidal. Further, when forming the first shielding layer on the ellipsoidal surface of the intermediate material layer, the first shielding layer may not be affected by the sharp corners or steep sidewalls. Correspondingly, a problem that the second shielding layer has uneven thickness and poor edge coverage in the first shielding layer may be avoided. The integrity of the shielding layer may be improved.

The first shielding layer is a magnetic field shielding layer and the second shielding layer is an electric field shielding layer; or the first shielding layer is an electric field shielding layer and the second shielding layer is a magnetic field shielding layer. By forming the first shielding layer and the second shielding layer with the above structure, the first shielding layer and the second shielding layer may shield the electric field and the magnetic field respectively, and the shielding performance of the shielding layer may be improved. The second shielding layer may cover a portion of the first shielding layer with uneven thickness and poor edge coverage. The overall shielding layer formed by the first shielding layer and the second shielding layer may be complete. The shielding performance may be improved.

After forming the external contact structures, the pre-packaging plate may be cut, to form discrete packaging structures. Massive fabrication of the packaging structure with the first shielding layer and the second shielding layer may be achieved, to improve fabrication efficiency.

The bottom shielding layer may be formed on the functional surfaces of the semiconductor chips. The bottom shielding layer may completely cover the functional surfaces of the semiconductor chips, and have surrounding edges flush with surrounding sidewalls of the semiconductor chips. The soldering pads may penetrate through the bottom shielding layer, and may be separated from the bottom shielding layer through isolation layers. When forming the first shielding layer, the first shielding layer may be connected to the surrounding edges of the bottom shielding layer. In the present method, the second shielding layer may be formed on the first shielding layer after forming the first shielding layer. By forming the second shielding layer on the first shielding layer, the second shielding layer may cover areas of the first shielding layer with an uneven thickness and poor edge coverage, thereby making an overall shield layer formed by the first shielding layer and the second shielding layer complete, to improve shielding performance. Further, the bottom shielding layer may be formed on the functional surfaces of the semiconductor chips, and when forming the first shielding layer, the first shielding layer may be connected to the surrounding edges of the bottom shielding layer. One of the semiconductor chips in the packaging structure may be completely or comprehensively covered by the bottom shielding layer and the first shielding layer. Correspondingly, the electric and magnetic field may not enter the packaging structure from a bottom of the packaging structure to induce the electromagnetic interference for the semiconductor chips. Then a completely electromagnetic shielding for the semiconductor chips may be achieved, further improving the electromagnetic shielding performance.

In the present disclosure, after adhering the first plastic encapsulation layer on the functional surfaces of the semiconductor chips to the carrier plate, the first shielding layer may be formed to cover the non-functional surfaces and the sidewalls of the semiconductor chips, and the first shielding layer may have the ellipsoidal surface on each semiconductor chip. The second shielding layer may be formed on the first shielding layer and the second plastic encapsulation layer may be formed on the second shielding layer and on the carrier plate between the semiconductor chips. Then the carrier plate may be peeled off to form the pre-packaging plate. The backside of the pre-packaging plate may expose the first plastic encapsulation layer. A portion of the first plastic encapsulation layer may be removed to expose the metal bumps. Then the external contact structures connected to the metal bumps may be formed on the backside of the pre-packaging plate. The first shielding layer with the ellipsoidal surface may evenly and completely cover the non-functional surfaces and the sidewalls of the semiconductor chip and the sidewalls of the bottom filling layer, and when forming the second shielding layer on the first shielding layer, uneven thickness and poor edge coverage in the second shielding layer may be prevented. The overall shielding layer formed by the first shielding layer and the second shielding layer may be complete. The shielding performance may be improved. And an integrated packaging of the semiconductor chips including the first shielding layers and the second shielding layers with the base plate may be achieved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method for a packaging structure, comprising:
    providing semiconductor chips, wherein each semiconductor chip includes a functional surface, a non-functional surface opposite to the functional surface, soldering pads on the functional surface, a metal bump on each soldering pad;
    forming a bottom shielding layer on the functional surface of each semiconductor chip to cover a whole functional surface of the semiconductor chip;
    forming a first plastic encapsulation layer on functional surfaces of the semiconductor chips and covering metal bumps of the semiconductor chips;
    providing a carrier plate;
    adhering the first plastic encapsulation layer on the functional surfaces of the semiconductor chips to the carrier plate;
    forming a first shielding layer covering non-functional surfaces and sidewalls of the semiconductor chips, wherein the first shielding layer is formed to connect to surrounding edges of the bottom shielding layer;
    forming a second shielding layer on the first shielding layer;
    forming a second plastic encapsulation layer on the second shielding layer and on a portion of the carrier plate between semiconductor chips;
    peeling off the carrier plate to form a pre-packaging plate, wherein a backside of the pre-packaging plate exposes the first plastic encapsulation layer;
    removing a portion of the first plastic encapsulation layer to expose metal bumps; and
    forming an external contact structure on the backside of the pre-packaging plate and connected to each metal bump, wherein
        the surrounding edges of the bottom shielding layer are flush with surrounding sidewalls of the semiconductor chips, and
        the soldering pads penetrate through the bottom shielding layer and are isolated from the bottom shielding layer by isolation layers.

2. The method according to claim 1, wherein:
    the first shielding layer is formed by a sputtering process and further covers at least a portion of the carrier plate between the semiconductor chips.

3. The method according to claim 2, wherein:
    the second shielding layer is disposed only on a portion of the first shielding layer on the non-functional surfaces and the sidewalls of the semiconductor chips;
    the second shielding layer has an ellipsoidal surface on each semiconductor chip; and
    the second shielding layer is formed by a selective plating process, a dispersing process, or a mesh printing process.

4. The method according to claim 3, wherein:
    the first shielding layer is made of copper, tungsten, aluminum, or a combination thereof; and
    the second shielding layer is made of copper, solder, conductive silver paste, or a combination thereof.

5. The method according to claim 1, wherein:
    the first shielding layer is a magnetic field shielding layer and the second shielding layer is an electric field shielding layer; or
    the first shielding layer is an electric field shielding layer and the second shielding layer is a magnetic field shielding layer.

6. The method according to claim 5, wherein:
    the electric field shielding layer is made of copper, tungsten, aluminum, or a combination thereof; and
    the magnetic field shielding layer is made of CoFeB, CoFeTa, NiFe, Co, CoFe, CoPt, Ni—Co—Fe alloy, or a combination thereof.

7. The method according to claim 1, wherein the semiconductor chips with the bottom shielding layer are formed by:
    providing a wafer;

forming the semiconductor chips on the wafer, wherein each semiconductor chip includes a top dielectric layer and a top interconnection structure in the top dielectric layer;

forming an isolation layer on the top dielectric layer of each semiconductor chips;

etching isolation layers to form first openings and second openings surrounding the first openings, wherein a remaining portion of the isolation layers are only located between the first openings and the second openings to separate the first openings from the second openings;

filling the first openings with metal to form the soldering pads;

filling the second openings with metal to form the bottom shielding layer;

forming a metal bump on each soldering pad;

forming the first encapsulation layer covering the metal bumps and the bottom shielding layer; and cutting the wafer to form the discrete semiconductor chips with the bottom shielding layer.

8. The method according to claim 7, wherein:

the soldering pads and the bottom shielding layer are formed by a same process including: forming a metal material layer in the first openings and the second openings, and on surfaces of the isolation layers; and planarizing the metal material layer to remove a portion of the metal material layer higher than the surfaces of the isolation layers, to form the soldering pads in the first openings and the bottom shielding layer in the second openings.

9. The method according to claim 1, wherein:

each external contact structure includes a rewiring layer connected to a corresponding metal bump on the first plastic encapsulation layer, and external contact parts on the rewiring layer and connected to the rewiring layer.

10. The method according to claim 9, further including:

after peeling off the carrier plate, forming an insulating layer on the backside of the pre-packaging plate and forming openings in the insulation layer to expose the metal bumps, wherein:

a rewiring layer is formed in each opening in the insulation layer and on a portion of the insulation layer; and the external contact parts are formed on a portion of each rewiring layer outside a corresponding opening.

11. The method according to claim 10, further including:

forming conductive contact structures in the insulating layer to electrically connect the first shielding layer to a portion of the rewiring layers.

12. The method according to claim 1, further including:

after forming the external contact structures, cutting the pre-packaging plate to form discrete packaging structures.

13. A fabrication method for a packaging structure, comprising:

providing semiconductor chips, wherein each semiconductor chip includes a functional surface, a non-functional surface opposite to the functional surface, soldering pads on the functional surface, a metal bump on each soldering pad;

forming a first plastic encapsulation layer on functional surfaces of the semiconductor chips and covering metal bumps of the semiconductor chips;

adhering the first plastic encapsulation layer on the functional surfaces of the semiconductor chips to a carrier plate;

forming a first shielding layer covering non-functional surfaces and sidewalls of the semiconductor chips;

forming a second shielding layer on the first shielding layer;

forming a second plastic encapsulation layer on the second shielding layer and on a portion of the carrier plate between semiconductor chips;

peeling off the carrier plate to form a pre-packaging plate, wherein a backside of the pre-packaging plate exposes the first plastic encapsulation layer;

removing a portion of the first plastic encapsulation layer to expose metal bumps; and forming an external contact structure on the backside of the pre-packaging plate and connected to each metal bump, wherein:

a thickness of the first shielding layer is equal to a thickness of the first plastic encapsulation layer on top surfaces of the metal bumps; and a portion of the first plastic encapsulation layer is removed by a polishing process to expose the metal bumps, and a portion of the first shielding layer between the semiconductor chips is removed simultaneously to make surfaces of the metal bumps flush with a surface of the second plastic encapsulation layer, a surface of a remaining portion of the first plastic encapsulation layer, a bottom surface of the first shielding layer, and a bottom surface of the second shielding layer.

14. The method according to claim 1, wherein:

the first shielding layer has an ellipsoidal surface on each semiconductor chip;

the first shielding layer is formed directly on the non-functional surfaces and the sidewalls of the semiconductor chips by a dispersing process or a mesh printing process; and the second shielding layer is formed by a sputtering process, a selective plating process, a dispersing process, or a mesh printing process.

15. The method according to claim 14, wherein:

the first shielding layer is made of solder, conductive silver paste, or a combination thereof; and the second shielding layer is made of copper, tungsten, aluminum, solder, conductive silver paste, or a combination thereof.

16. The method according to claim 14, before forming the first shielding layer, further including forming an intermediate material layer on the non-functional surfaces and the sidewalls of the semiconductor chips, wherein:

the intermediate material layer has an ellipsoidal surface on each semiconductor chip;

the first shielding layer is formed on the intermediate material layer; and the first shielding layer has the ellipsoidal surface on each semiconductor chip.

* * * * *